United States Patent
Li

(10) Patent No.: US 7,781,231 B2
(45) Date of Patent: Aug. 24, 2010

(54) METHOD OF FORMING A MAGNETIC TUNNEL JUNCTION DEVICE

(75) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 216 days.

(21) Appl. No.: 12/044,596

(22) Filed: Mar. 7, 2008

(65) Prior Publication Data

US 2009/0224341 A1 Sep. 10, 2009

(51) Int. Cl.
*H01L 21/00* (2006.01)
(52) U.S. Cl. .................. 438/3; 438/48; 438/59; 257/295; 257/421; 257/E21.665
(58) Field of Classification Search .............. 438/3, 438/48, 59; 257/295, 421, E21.665
See application file for complete search history.

(56) References Cited

U.S. PATENT DOCUMENTS

| 6,072,718 | A | 6/2000 | Abraham et al. | |
| 6,621,730 | B1* | 9/2003 | Lage | 365/158 |
| 7,109,539 | B2 | 9/2006 | Lu | |
| 2002/0105035 | A1* | 8/2002 | Sandhu et al. | 257/375 |
| 2006/0033133 | A1* | 2/2006 | Liu et al. | 257/295 |

OTHER PUBLICATIONS

"MRAM Fact Sheet," Document No. MRAMTECHFS, Rev 6, Freescale Semiconductor, Inc. 2007.

Gallagher; Parkin, "Development of the Magnetic Tunnel Junction MRAM at IBM: from first junctions to a 16-Mb MRAM demonstrator chip," IBM J. Res. & Dev. vol. 50 No. 1 Jan. 2006, 0018-8646/06 2006 IBM.

Kimura; Pagiamtzis; Sheikholeslami; and Hanyu, "A Study of Multiple-Valued Magnetoresistive RAM (MRAM) Using Binary MTJ Devices," Graduate School of Information Sciences, Tohoku University, Aoba-Yama 05, Sendai 980-8579, Japan and Department of Electrical and Computer Engineering, University of Toronto, 10 Kings's College Road, Toronto, ON M5S 3G4, Canada.

International Search Report-PCT/US2009/035377, International Search Authority-European Patent Office Jun. 8, 2009.

Written Opinion-PCT/US2009/035377, International Search Authority-European Patent Office Jun. 8, 2009.

* cited by examiner

*Primary Examiner*—Long K Tran
(74) *Attorney, Agent, or Firm*—Nicholas J. Pauley; Sam Talpalatsky; Peter Kamarchik

(57) ABSTRACT

A method of manufacturing a magnetic tunnel junction device is disclosed that includes forming a trench in a substrate, depositing a conductive terminal within the trench, and depositing a magnetic tunnel junction (MTJ) structure within the trench. The MTJ structure includes a fixed magnetic layer having a fixed magnetic orientation, a tunnel junction layer, and a free magnetic layer having a configurable magnetic orientation. The fixed magnetic layer is coupled to the conductive terminal along an interface that extends substantially normal to a surface of the substrate. The free magnetic layer that is adjacent to the conductive terminal carries a magnetic domain adapted to store a digital value.

20 Claims, 28 Drawing Sheets

METHOD OF FORMING A MAGNETIC TUNNEL JUNCTION DEVICE

I. FIELD

The present disclosure is generally related to a method of forming a magnetic tunnel junction cell including multiple lateral magnetic domains.

II. DESCRIPTION OF RELATED ART

In general, widespread adoption of portable computing devices and wireless communication devices has increased demand for high-density and low-power non-volatile memory. As process technologies have improved, it has become possible to fabricate magneto-resistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells with a single magnetic domain. An MTJ cell typically includes an anti-ferromagnetic layer (AF), a fixed magnetic layer, a barrier layer (i.e., a tunneling oxide layer), and a free magnetic layer, where a bit value is represented by a magnetic field induced in the free magnetic layer. A direction of the magnetic field of the free layer relative to a direction of a fixed magnetic field carried by the fixed magnetic layer determines the bit value.

Conventionally, to improve data density using MTJ devices, one technique includes reducing the size of MTJ devices to put more MTJ devices in a smaller area. However, the size of the MTJ devices is limited by the fabrication process technology. Another technique involves forming multiple MTJ structures in a single MTJ device. For example, in one instance, a first MTJ structure is formed that includes a first fixed layer, a first tunnel barrier, and a first free layer. A dielectric material layer is formed on the first MTJ structure, and a second MTJ structure is formed on top of the dielectric material layer. Such structures increase the density of storage in an X-Y direction while increasing a size of the memory array in a z-direction. Unfortunately, such structures store only one bit per cell, so the data density in the X-Y direction is increased at the expense of area in a Z-direction and cost of manufacture. Further, such structures increase wire-trace routing complexity. Hence, there is a need for improved memory devices with greater storage density without increasing a circuit area of each of the MTJ cells and that can scale with the process technology.

III. SUMMARY

In a particular embodiment, a magnetic tunnel junction (MTJ) cell includes a substrate having a trench having a first sidewall and a second sidewall. The MTJ cell further includes a first lateral electrode disposed within the trench adjacent to the first sidewall and a second lateral electrode disposed within the trench adjacent to the second sidewall. The MTJ cell further includes a magnetic tunnel junction (MTJ) structure disposed within the trench. The MTJ structure includes a fixed magnetic layer having a magnetic field with a fixed magnetic orientation, a tunnel junction layer, and a free magnetic layer having a magnetic field with a configurable magnetic orientation. The MTJ structure may also include an anti-ferromagnetic layer. The MTJ structure contacts the first lateral electrode at a first lateral interface and contacts the second lateral electrode at a second lateral interface. The free magnetic layer that is adjacent to the first lateral electrode is adapted to carry a first magnetic domain to store a first digital value. The free magnetic layer that is adjacent to the second lateral electrode is adapted to carry a second magnetic domain to store a second digital value.

In another particular embodiment, a method of manufacturing a magnetic tunnel junction structure is disclosed that includes forming a trench in a substrate, depositing a conductive terminal within the trench, and depositing a magnetic tunnel junction (MTJ) structure within the trench. The MTJ structure includes a fixed magnetic layer having a fixed magnetic orientation, a tunnel junction layer, and a free magnetic layer having a configurable magnetic orientation. The MTJ structure may also include an anti-ferromagnetic layer. The fixed magnetic layer contacts the conductive terminal along an interface that extends substantially normal to a surface of the substrate. The free magnetic layer that is adjacent to the conductive terminal carries a magnetic domain adapted to store a digital value.

In still another particular embodiment, a method of forming a magnetic tunnel junction structure is disclosed that includes forming a trench in a substrate, where the trench includes a first sidewall, a second sidewall, a third sidewall, a fourth sidewall, and a bottom wall. The method includes depositing a first conductive terminal within the trench proximate to the first sidewall and depositing a second conductive terminal within the trench. The method further includes depositing a magnetic tunnel junction (MTJ) structure within the trench. The MTJ structure may include an anti-ferromagnetic layer, a fixed magnetic layer having a magnetic field with a fixed magnetic orientation, a tunnel junction layer, and a free magnetic layer having a magnetic field with a configurable magnetic orientation. The fixed magnetic layer contacts the first, the second, the third, and the fourth sidewalls at respective first, second, third, and fourth lateral interfaces and contacts the bottom wall at a bottom interface. The free magnetic layer that is adjacent to the first conductive terminal is adapted to carry a first magnetic domain to store a first digital value and the free magnetic layer that is adjacent to the second conductive terminal is adapted to carry a second magnetic domain to store a second digital value.

One particular advantage provided by embodiments of the magnetic tunnel junction (MTJ) device is provided in that multiple data bits may be stored at a single MTJ cell. In this instance, a data storage density of a single bit MTJ cell may be doubled, tripled or quadrupled, depending on the particular implementation.

Another particular advantage is provided in that lateral electrodes provide a shorter contact distance, enhancing efficiency and reducing parasitic resistances and capacitances due to wiring.

Still another advantage is that the multiple bit MTJ cell can scale with process technology, allowing for multi-bit MTJ cells even as the MTJ cell size decreases.

Still another particular advantage is provided in that the MTJ cell can include multiple independent magnetic domains to store multiple data bits. In a particular embodiment, the MTJ cell can include multiple sidewalls (extending vertically from a planar surface of a substrate), where each of the multiple sidewalls carries a unique lateral magnetic domain to store a data bit. Additionally, the MTJ cell can include a bottom wall including a horizontal magnetic domain to store another data bit.

Yet another particular advantage is provided in that the MTJ cell can include multiple independent magnetic domains. Each of the multiple independent magnetic domains may be written to or read from without changing data stored at other magnetic domains within the MTJ cell.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
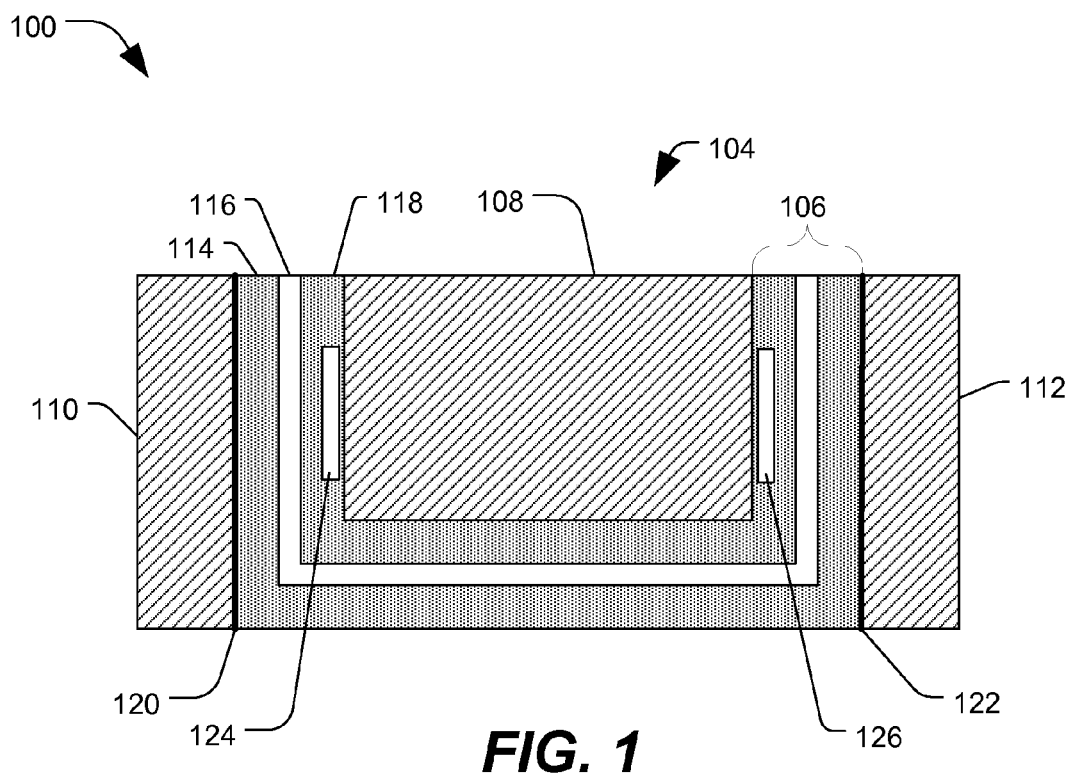
FIG. 1 is a cross-sectional diagram of a particular illustrative embodiment of a magnetic tunnel junction (MTJ) stack including lateral magnetic domains.

FIG. 1 is a cross-sectional diagram of a particular illustrative embodiment of a magnetic tunnel junction (MTJ) cell 100 including lateral magnetic domains. The MTJ cell 100 includes a magnetic tunnel junction (MTJ) structure 104 having an MTJ stack 106, a center electrode 108, a first lateral electrode 110, and a second lateral electrode 112. The MTJ stack 106 includes a fixed magnetic layer 114 that carries a magnetic domain having a fixed magnetic orientation, a tunnel barrier layer 116, and a free magnetic layer 118 having a configurable magnetic orientation. The MTJ stack 106 may also include an anti-ferromagnetic (AF) layer (not shown) that pins the fixed magnetic layer 114. The MTJ stack 106 may also include additional layers (not shown). The fixed magnetic layer 114 is coupled to the first lateral electrode 110 via the AF layer at first lateral interface 120 and contacts the second lateral electrode 112 at a second lateral interface 122. It should be understood that the fixed magnetic layer 114 and the free magnetic layer 118 may be switched, such that the free magnetic layer 118 contacts the first and second lateral electrodes 110 and 112 at the first and second lateral interfaces 120 and 122, respectively. In general, the free magnetic layer 118 has a first portion that carries a first magnetic domain 124 (illustrated at 2612 in FIG. 26) adjacent to the first lateral electrode 110 and has a second portion that carries a second magnetic domain 126 (illustrated at 2616 in FIG. 26) adjacent to the second lateral electrode 112.

In a particular embodiment, the dimensions of the MTJ cell 100 (i.e., length, width, and depth) determine an orientation of a magnetic domain within the free layer 118. In particular, the magnetic domain along a particular wall aligns in a direction corresponding to a longest dimension of the particular wall. If the wall has a depth that is greater than its length, the magnetic domain is oriented in a direction of the depth. In contrast, if the wall has a length that is greater than the depth, the magnetic domain is oriented in a direction of the length. The particular direction of the magnetic field associated with the magnetic domain of the free layer 118 relative to a fixed direction of a magnetic field associated with the magnetic domain of the fixed layer 114 represents a data bit value.

In another particular embodiment, the fixed magnetic layer 114 and the free magnetic layer 118 are formed from a ferromagnetic material. The tunnel barrier layer 116 may be formed from oxidation of metal material, such as magnesium oxide (MgO). A read current may be applied via the center electrode 108 and the lateral electrodes 110 and 112 to read data bit values represented by the first magnetic domain 124 and the second magnetic domain 126. In a particular example, the first magnetic domain 124 and the second magnetic domain 126 may be adapted to represent unique data bit values.

Figure 2:
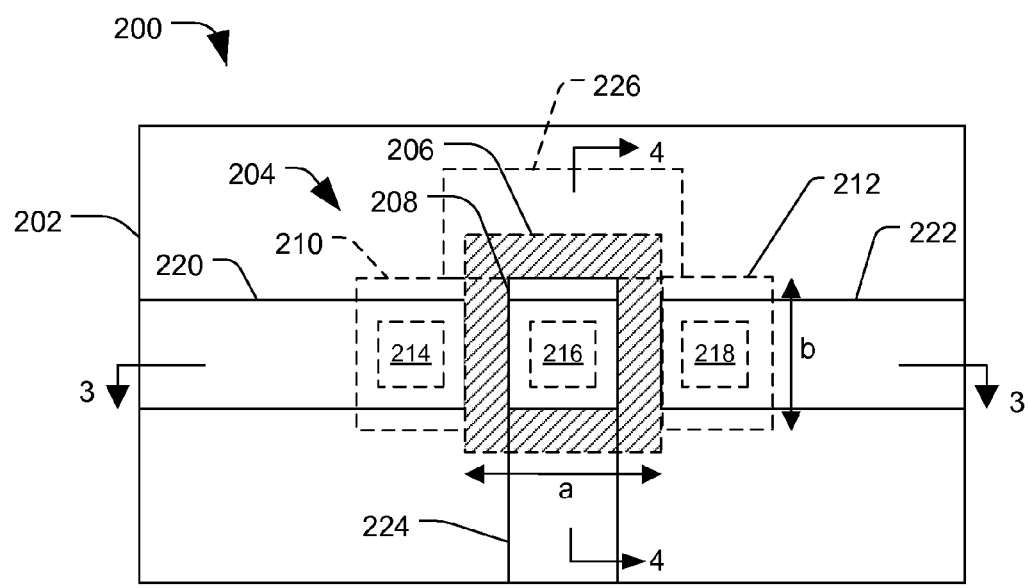
FIG. 2 is top view of a particular illustrative embodiment of a circuit device including an MTJ cell having multiple lateral magnetic domains.

FIG. 2 is top view of a particular illustrative embodiment of a circuit device 200 including an MTJ cell having multiple lateral magnetic domains. The circuit device 200 includes a substrate 202. The substrate 202 includes a magnetic tunnel junction (MTJ) structure 204 that has an MTJ stack 206, a center electrode 208, a first lateral electrode 210, and a second lateral electrode 212. The MTJ stack 206 has a length (a) and a width (b), where the length (a) is greater than the width (b). The substrate 202 includes a first via 214 coupled to the first lateral electrode 210, a center via 216 coupled to the center electrode 208, and a second via 218 coupled to the second lateral electrode 212. The substrate 202 also includes a first wire trace 220 coupled to the first via 214, a second wire trace 222 coupled to the second via 218, and a third wire trace 224 coupled to the center via 216. The substrate 202 also includes a process opening 226. In a particular embodiment, the MTJ structure 204 is adapted to store a first data value, such as a first bit value, and a second data value, such as a second bit value, within a free layer of the MTJ stack 206 that is adjacent to the first and second lateral electrodes 210 and 212.

Figure 3:
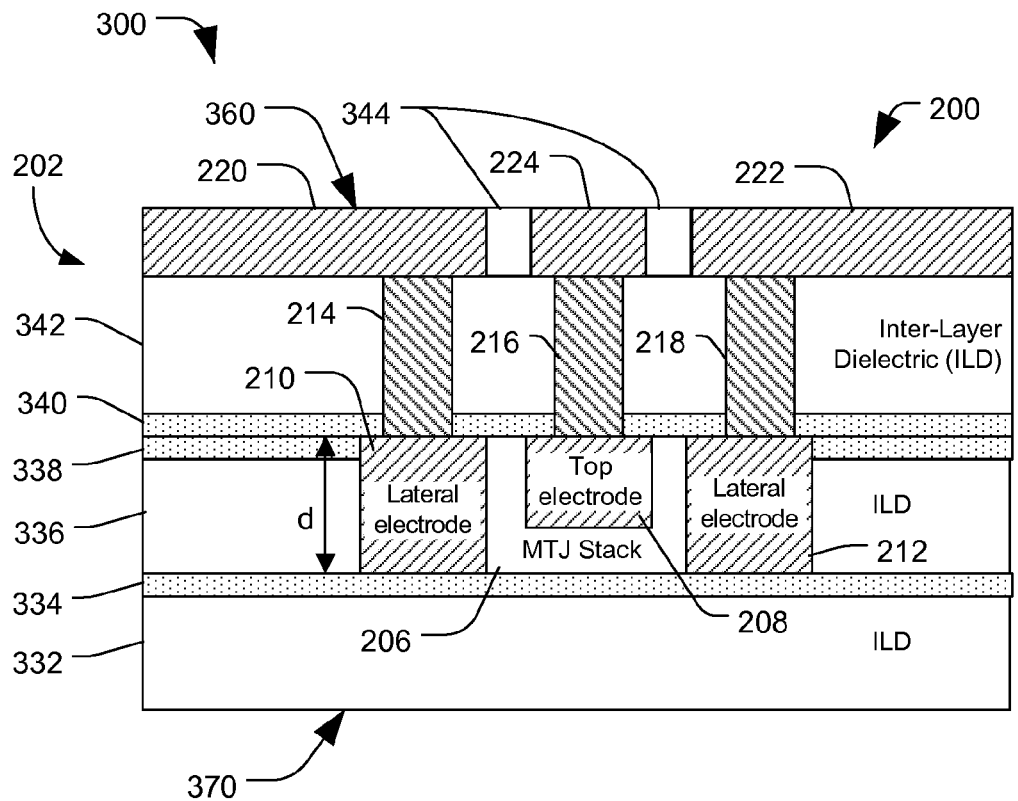
FIG. 3 is a cross-sectional diagram of the circuit device of FIG. 2 taken along line 3-3 in FIG. 2.

FIG. 3 is a cross-sectional diagram 300 of the circuit device 200 of FIG. 2 taken along line 3-3 in FIG. 2. The diagram 300 illustrates the substrate 202 including a first inter-layer dielectric layer 332, a first cap layer 334, a second inter-layer dielectric layer 336, a second cap layer 338, a third cap layer 340, a third inter-layer dielectric layer 342, and a fourth inter-layer dielectric layer 344. The substrate 202 includes a first surface 360 and a second surface 370. The substrate 202 also includes the MTJ structure 204 including the MTJ stack 206. The first lateral electrode 210, the second lateral electrode 212, and the MTJ stack 206 are disposed within a trench in the substrate 202. The trench has a depth (d). The substrate 202 includes the first, second and third wire traces 220, 222, and 224 deposited and patterned at the first surface 360. The first wire trace 220 is coupled to the first via 214, which extends from the first wire trace 220 to the first lateral electrode 210. The second wire trace 222 is coupled to the second via 218, which extends from the second wire trace 222 to the second lateral electrode 212. The third wire trace 224 is coupled to the center via 216, which extends from the third wire trace 224 to the center (top) electrode 208. The center electrode 208 is coupled to the MTJ stack 206.

In general, the MTJ stack 206 is adapted to store a first data bit value within a first portion of the free layer of the MTJ stack 206 that is adjacent to the first lateral electrode 210. The MTJ stack 206 is also adapted to store a second data bit value within a second portion of the free layer of the MTJ stack 206 that is adjacent to the second lateral electrode 212. A data bit value can be read from the MTJ stack 206 by applying a voltage between the third wire trace 224 and the first wire trace 220 or the second wire trace 222 and by comparing a current at the first wire trace 220 and/or the second wire trace 222 to a reference current. Alternatively, a data bit value may be written to the MTJ stack 206 by applying a write current between the first wire trace 220 and the third wire trace 224 or between the second wire trace 222 and the third wire trace 224. In a particular embodiment, the width (b) of the MTJ stack 206 illustrated in FIG. 2 is greater than the depth (d), and respective magnetic domains carried by a free layer within the MTJ stack 206 adjacent to the lateral electrodes 210 and 212 extend in a direction that is substantially parallel to the surface 360 of the substrate 202 in a direction of the width (b) of the MTJ stack 206 (i.e., into or out from the page view of FIG. 3). If the width (b) of the MTJ stack 206 is less than the depth (d), respective magnetic fields of the free layer within the MTJ stack 206 adjacent to the lateral electrodes 210 and 212 may be vertical, i.e. along the trench depth direction. Generally, the MTJ structures illustrated in FIGS. 2-13 may be patterned by reverse trench photo-etch processes and MTJ Chemical-Mechanical Polishing (CMP) processes to control trench dimensions, and therefore to control the MTJ dimensions.

Figure 4:
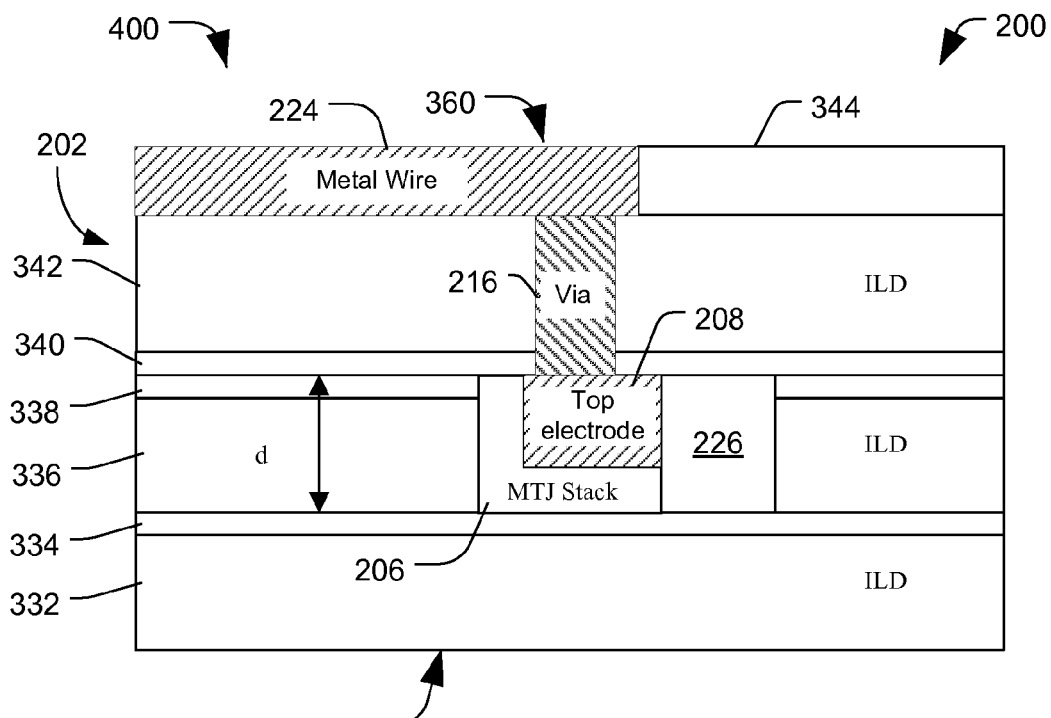
FIG. 4 is a cross-sectional diagram of the circuit device of FIG. 2 taken along line 4-4 in FIG. 2.

FIG. 4 is a cross-sectional diagram 400 of the circuit device 200 of FIG. 2 taken along line 4-4 in FIG. 2. The diagram 400 includes the substrate 202 having the first inter-layer dielectric layer 332, the first cap layer 334, the second inter-layer dielectric layer 336, the second cap layer 338, the third cap layer 340, the third inter-layer dielectric layer 342, and the fourth inter-layer dielectric layer 344. The substrate 202 includes the MTJ stack 206, the top electrode 208, and a center via 216 that extends from the third wire trace 224 to the top electrode 208. The substrate 202 also includes the process opening 226, which may be formed by selectively removing a portion of the MTJ structure 204 and filled by depositing an inter-layer dielectric material within the processing opening 226.

In a particular illustrative embodiment, the MTJ structure 204 is a substantially u-shaped structure including three sidewalls and a bottom wall. The MTJ structure 204 can include lateral electrodes, such as the first and second lateral electrodes 210 and 212, that are associated with respective sidewalls and can include a bottom electrode that is associated with the bottom wall. Additionally, the MTJ structure 204 is adapted to store up to four unique data bits.

Figure 5:
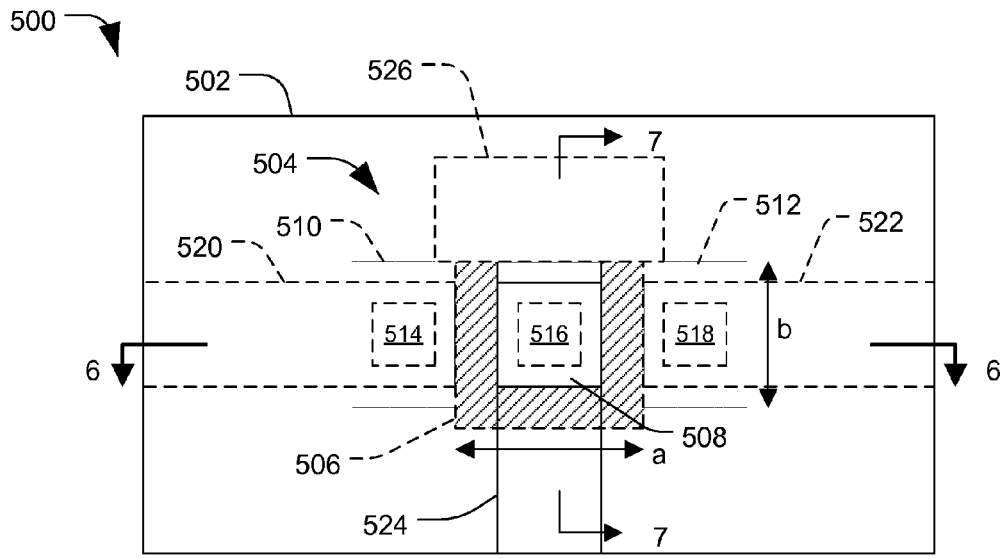
FIG. 5 is top view of a second particular illustrative embodiment of a circuit device including an MTJ cell having multiple lateral magnetic domains.

FIG. 5 is top view of a particular illustrative embodiment of a circuit device 500 including an MTJ cell having multiple lateral magnetic domains. The circuit device 500 includes a substrate 502. The substrate 502 includes a magnetic tunnel junction (MTJ) structure 504 that has an MTJ stack 506, a center electrode 508, a first lateral electrode 510, and a second lateral electrode 512. The MTJ stack 506 has a length (a) and a width (b). The substrate 502 includes a first via 514 coupled to the first lateral electrode 510, a center via 516 coupled to the center electrode 508, and a second via 518 coupled to the second lateral electrode 512. The substrate 502 also includes a first wire trace 520 coupled to the first via 514, a second wire trace 522 coupled to the second via 518, and a third wire trace 524 coupled to the center via 516. The substrate 502 also includes a process opening 526. In a particular embodiment, the MTJ structure 504 is adapted to store a first data bit value and a second data bit value within a free layer of the MTJ stack 506 that is adjacent to the first and second lateral electrodes 510 and 512.

Figure 6:
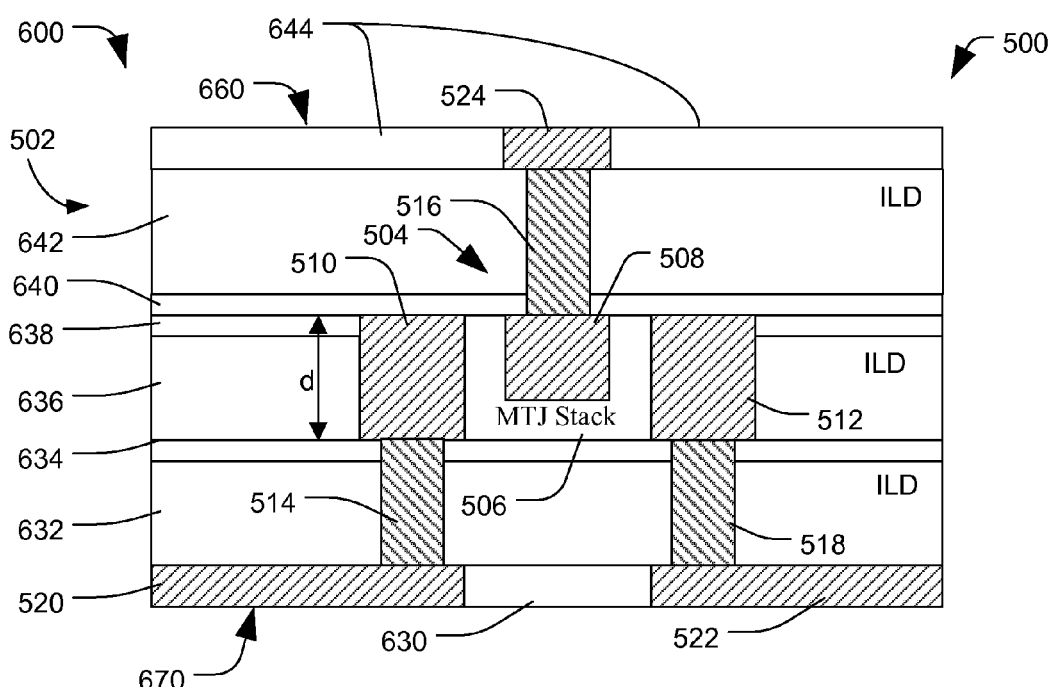
FIG. 6 is a cross-sectional diagram of the circuit device of FIG. 5 taken along line 6-6 in FIG. 5.

FIG. 6 is a cross-sectional diagram 600 of the circuit device 500 of FIG. 5 taken along line 6-6 in FIG. 5. The diagram 600 illustrates the substrate 502 including a first inter-layer dielectric layer 630, a second inter-layer dielectric layer 632, a first cap layer 634, a third inter-layer dielectric layer 636, a second cap layer 638, a third cap layer 640, a fourth inter-layer dielectric layer 642, and a fifth inter-layer dielectric layer 644. The substrate 502 includes a first surface 660 and a second surface 670. The substrate 502 also includes the MTJ structure 504 including the MTJ stack 506. The first lateral electrode 510, the second lateral electrode 512, and the MTJ stack 506 are disposed within a trench in the substrate 502. The trench has a depth (d). The substrate 502 includes the third wire trace 524 deposited and patterned at the first surface 660 and includes the first and second wire traces 520 and 522 deposited and patterned at the second surface 670. The first wire trace 520 is coupled to the first via 514, which extends from the first wire trace 520 to the first lateral electrode 510. The second wire trace 522 is coupled to the second via 518, which extends from the second wire trace 522 to the second lateral electrode 512. The third wire trace 524 is coupled to the center via 516, which extends from the third wire trace 524 to the center (top) electrode 508. The center electrode 508 is coupled to the MTJ stack 506.

In general, the MTJ stack 506 is adapted to store a first data bit value within a free layer of the MTJ stack 506 that is adjacent to the first lateral electrode 510. The MTJ stack 506 is also adapted to store a second data bit value within the free layer of the MTJ stack 506 that is adjacent to the second lateral electrode 512. A data bit value can be read from the MTJ stack 506 by applying a voltage between the third wire trace 524 and the first wire trace 520 or the second wire trace 522 and by comparing a current at the first wire trace 520 and/or the second wire trace 522 to a reference current. Alternatively, a data bit value may be written to the MTJ stack 506 by applying a write current between the first wire trace 520 and the third wire trace 524 or between the second wire trace 522 and the third wire trace 524. In a particular embodiment, the width (b) of the MTJ stack 506 illustrated in FIG. 5 is greater than the depth (d), and respective magnetic domains carried by a free layer within the MTJ stack 506 adjacent to the lateral electrodes 510 and 512 extend in a direction that is substantially parallel to the surface 660 of the substrate 502 in a direction of the width (b) of the MTJ stack 506 (i.e., into or out from the page view of FIG. 6). If width (b) of the MTJ stack 506 is smaller than the depth (d), respective magnetic fields of free layer within the MTJ stack 506 adjacent to the lateral electrode 510 and 512 may be vertical along the trench depth direction.

Figure 7:
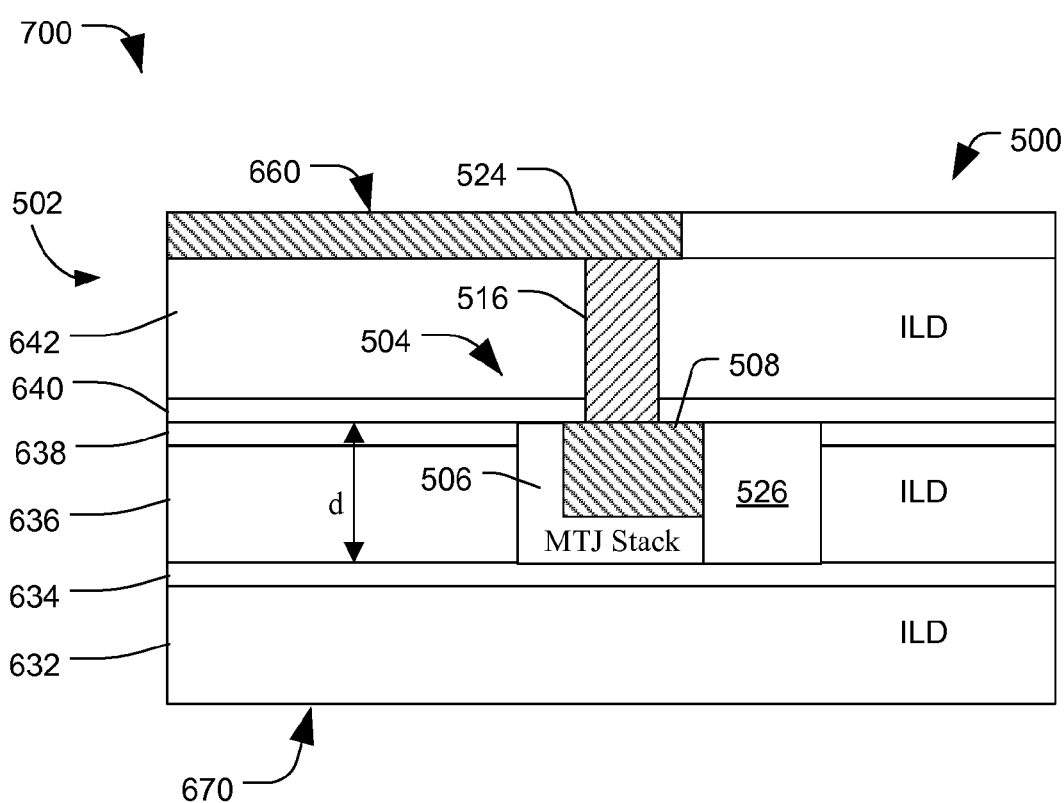
FIG. 7 is a cross-sectional diagram of the circuit device of FIG. 5 taken along line 7-7 in FIG. 5.

FIG. 7 is a cross-sectional diagram 700 of the circuit device 500 of FIG. 5 taken along line 7-7 in FIG. 5. The diagram 700 includes the substrate 502 having the second inter-layer dielectric layer 632, the first cap layer 634, the third inter-layer dielectric layer 636, the second cap layer 638, the third cap layer 640, the fourth inter-layer dielectric layer 642, and the fifth inter-layer dielectric layer 644. The substrate 502 includes the MTJ stack 506, the top electrode 508, and a center via 516 that extends from the third wire trace 524 to the top electrode 508. The substrate 502 also includes the process opening 526, which may be formed by selectively removing a portion of the MTJ structure 504 and filled by depositing an inter-layer dielectric material within the processing opening 526.

In a particular illustrative embodiment, the MTJ structure 504 is a substantially u-shaped structure including three sidewalls and a bottom wall. The MTJ structure 504 can include lateral electrodes, such as the first and second lateral electrodes 510 and 512, that are associated with respective sidewalls and can include a bottom electrode that is associated with the bottom wall. Additionally, the MTJ structure 504 is adapted to store up to four unique data bits.

Figure 8:
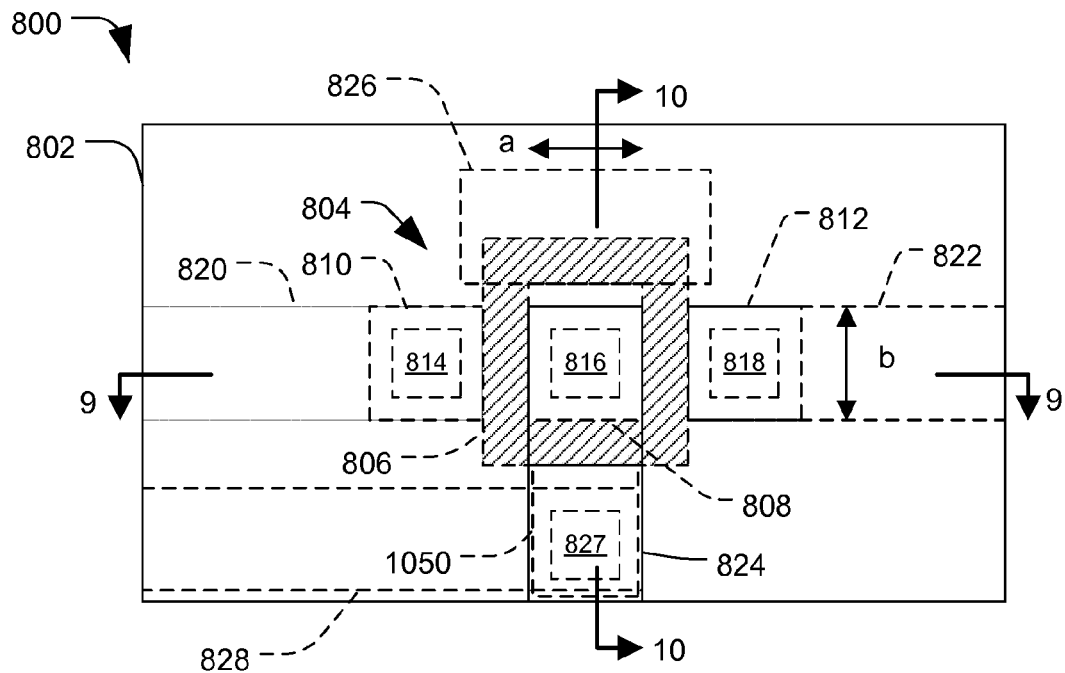
FIG. 8 is top view of a third particular illustrative embodiment of a circuit device including an MTJ cell having multiple lateral magnetic domains.

FIG. 8 is top view of a third particular illustrative embodiment of a circuit device 800 including an MTJ cell having multiple lateral magnetic domains. The circuit device 800 includes a substrate 802. The substrate 802 includes a magnetic tunnel junction (MTJ) structure 804 that has an MTJ stack 806, a center electrode 808, a first lateral electrode 810, a second lateral electrode 812, and a third lateral electrode 1050. The MTJ stack 806 has a length (a) and a width (b), where the length (a) is greater than the width (b). The substrate 802 includes a first via 814 coupled to the first lateral electrode 810, a center via 816 coupled to the center electrode 808, a second via 818 coupled to the second lateral electrode 812, and a third via 827 coupled to the third lateral electrode 1050. The substrate 802 also includes a first wire trace 820 coupled to the first via 814, a second wire trace 822 coupled to the second via 818, and a third wire trace 824 coupled to the center via 816. The substrate 802 also includes a process opening 826. The substrate 802 also includes a fourth wire trace 828 coupled to a third via 827. In a particular embodiment, the MTJ structure 804 is adapted to store a first data bit value within a first portion free layer of the MTJ stack 806 that is adjacent to the first lateral electrode 810, a second data bit value within a second portion of the free layer that is adjacent to the second lateral electrode 812, and a third data bit value within a third portion of the free layer that is adjacent to the third lateral electrode 1050.

Figure 9:
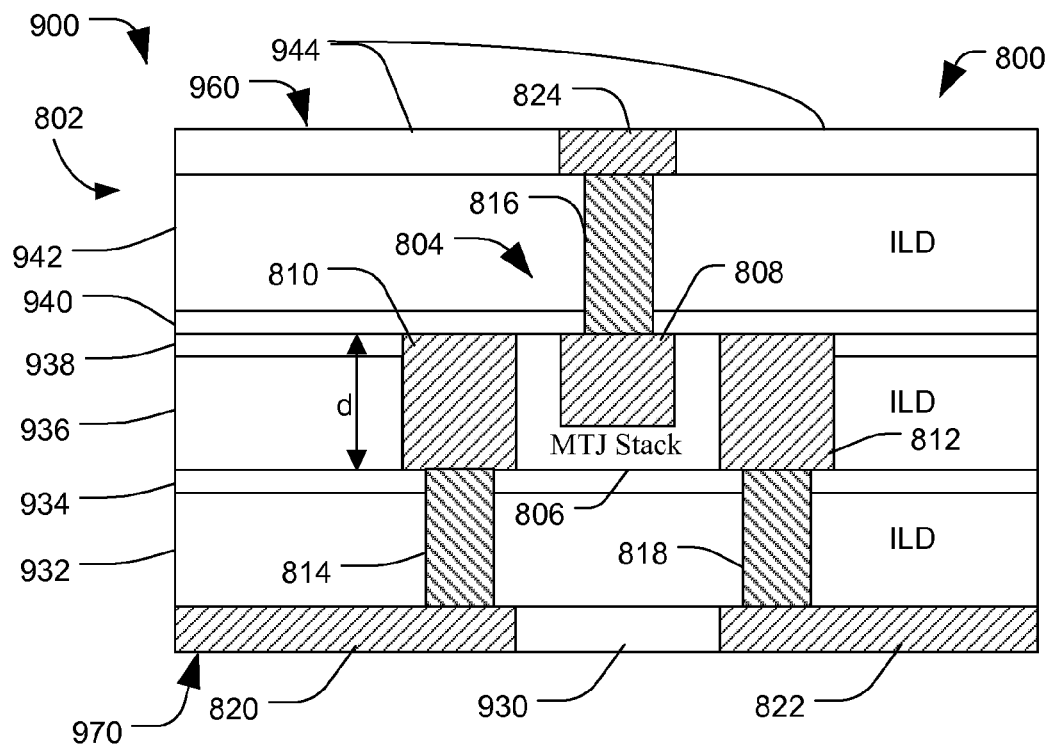
FIG. 9 is a cross-sectional diagram of the circuit device of FIG. 8 taken along line 9-9 in FIG. 8.

FIG. 9 is a cross-sectional diagram 900 of the circuit device 800 of FIG. 8 taken along line 9-9 in FIG. 8. The diagram 900 illustrates the substrate 802 including a first inter-layer dielectric layer 930, a second inter-layer dielectric layer 932, a first cap layer 934, a third inter-layer dielectric layer 936, a second cap layer 938, a third cap layer 940, a fourth inter-layer dielectric layer 942, and a fifth inter-layer dielectric layer 944. The substrate 802 includes a first surface 960 and a second surface 970. The substrate 802 also includes the MTJ structure 804 including the MTJ stack 806. The first lateral electrode 810, the second lateral electrode 812, and the MTJ stack 806 are disposed within a trench in the substrate 802. The trench has a depth (d). The substrate 802 includes the third wire trace 824 deposited and patterned at the first surface 960 and includes the first and second wire traces 820 and 822 deposited and patterned at the second surface 970. The first wire trace 820 is coupled to the first via 814, which extends from the first wire trace 820 to the first lateral electrode 810. The second wire trace 822 is coupled to the second via 818, which extends from the second wire trace 822 to the second lateral electrode 812. The third wire trace 824 is coupled to the center via 816, which extends from the third wire trace 824 to the center (top) electrode 808. The center electrode 808 is coupled to the MTJ stack 806.

In general, the MTJ stack 806 is adapted to store a first data bit value within a first portion of the free layer of the MTJ stack 806 that is adjacent to the first lateral electrode 810. The MTJ stack 806 is also adapted to store a second data bit value within a second portion of the free layer of the MTJ stack 806 that is adjacent to the second lateral electrode 812. The MTJ stack 806 is also adapted to store a third data bit value within a third portion of the free layer of the MTJ stack 806 that is adjacent to the third lateral electrode 1050. A data value can be read from the MTJ stack 806 by applying a voltage between the third wire trace 824 and the first wire trace 820, the second wire trace 822, or the fourth wire trace 828 and by comparing a current at the third wire trace 824 or at the first wire trace 820, the second wire trace 822, or the fourth wire trace 828 to a reference current. Alternatively, a data value may be written to the MTJ stack 806 by applying a write current between the first wire trace 820, or the second wire trace 822, or the fourth wire trace 828, and the third wire trace 824. In a particular embodiment, the length (a) and the width (b) of the MTJ stack 806 illustrated in FIG. 8 are greater than the depth (d), and respective magnetic domains carried by a free layer within the MTJ stack 806 adjacent to the lateral electrodes 810, 812, and 1050 extend in a direction that is substantially parallel to the surface 960 of the substrate 802 in a direction of the width (b) or length (a) of the MTJ stack 806 (i.e., into or out from the page view of FIG. 9). If the length (a) and width (b) of the MTJ stack 806 are smaller than the depth (d), respective magnetic fields of free layer within the MTJ stack 806 adjacent to the lateral electrodes 810, 812, and 1050 may be vertical along the trench depth direction.

Figure 10:
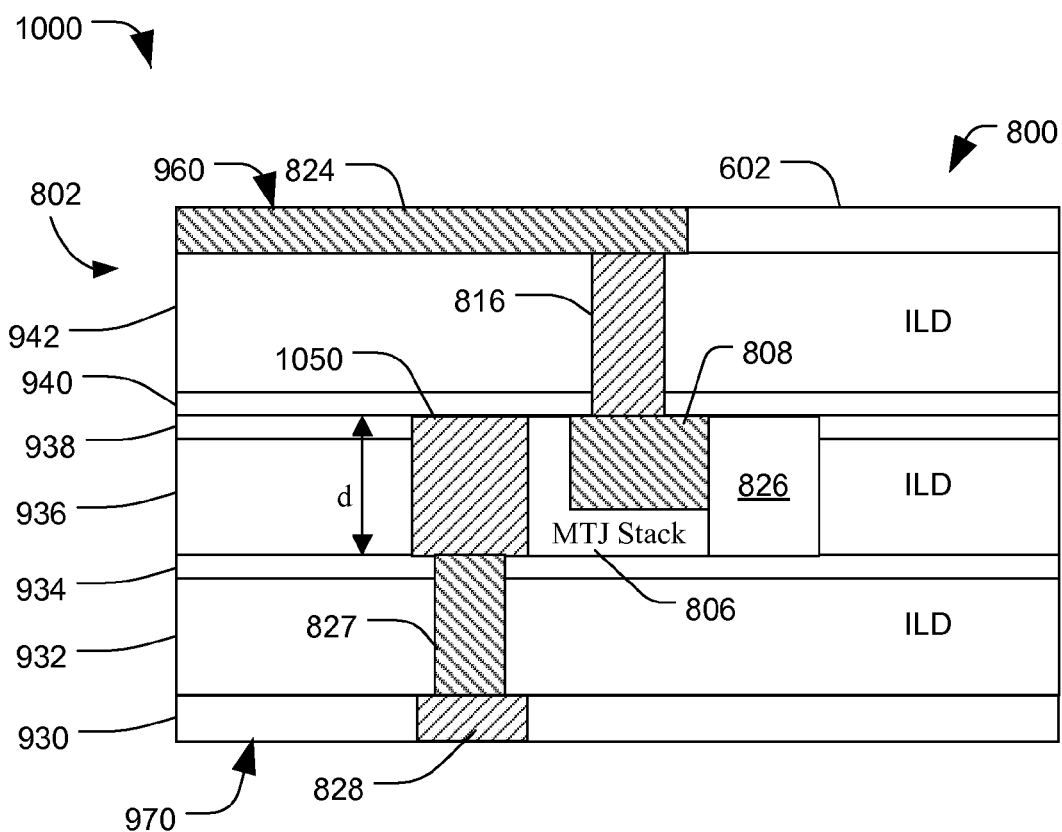
FIG. 10 is a cross-sectional diagram of the circuit device of FIG. 8 taken along line 10-10 in FIG. 8.

FIG. 10 is a cross-sectional diagram 1000 of the circuit device 800 of FIG. 8 taken along line 10-10 in FIG. 8. The diagram 1000 includes the substrate 802 having the first inter-layer dielectric layer 930, the second inter-layer dielectric layer 932, the first cap layer 934, the third inter-layer dielectric layer 936, the second cap layer 938, the third cap layer 940, the fourth inter-layer dielectric layer 942, and the fifth inter-layer dielectric layer 944. The substrate 802 includes the MTJ stack 806, the top electrode 808, and a center via 816 that extends from the third wire trace 824 to the top electrode 808. The substrate 802 also includes the process opening 826, which may be formed by selectively removing a portion of the MTJ structure 804 and filled by depositing an inter-layer dielectric material within the processing opening 826. The substrate 802 also includes the fourth wire trace 828 coupled to the third via 827, which extends from the fourth wire trace 828 to a third lateral electrode 1050, which is coupled to the MTJ stack 806.

In a particular illustrative embodiment, the MTJ structure 804 is a substantially u-shaped structure including three sidewalls and a bottom wall. In the cross-sectional view of FIG. 10, the MTJ stack 806 is an L-shaped structure. The MTJ structure 804 can include lateral electrodes, such as the first, second, and third lateral electrodes 810, 812, and 1050, that are associated with respective sidewalls and can include a bottom electrode (not shown) that is associated with the bottom wall. Additionally, the MTJ structure 804 is adapted to store up to four unique data bits.

Figure 11:
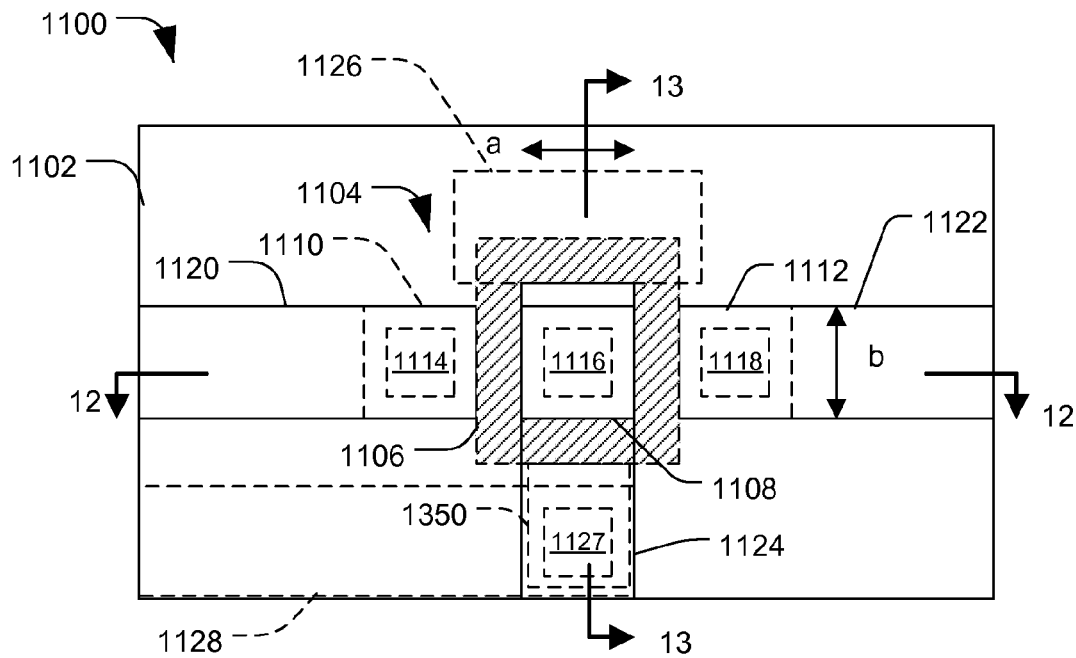
FIG. 11 is top view of a fourth particular illustrative embodiment of a circuit device including an MTJ cell having multiple lateral magnetic domains.

FIG. 11 is top view of a fourth particular illustrative embodiment of a circuit device 1100 including an MTJ cell having multiple lateral magnetic domains. The circuit device 1100 includes a substrate 1102. The substrate 1102 includes a magnetic tunnel junction (MTJ) structure 1104 that has an MTJ stack 1106, a center electrode 1108, a first lateral electrode 1110, and a second lateral electrode 1112. The MTJ stack 1106 has a length (a) and a width (b), where the length (a) is greater than the width (b). The substrate 1102 includes a first via 1114 coupled to the first lateral electrode 1110, a center via 1116 coupled to the center electrode 1108, a second via 1118 coupled to the second lateral electrode 1112, and a third via 1127 coupled to a third lateral electrode 1350. The substrate 1102 also includes a first wire trace 1120 coupled to the first via 1114, a second wire trace 1122 coupled to the second via 1118, and a third wire trace 1124 coupled to the center via 1116. The substrate 1102 also includes a process opening 1126. The substrate 1102 includes a third via 1127 and a fourth wire trace 1128. In a particular embodiment, the MTJ structure 1104 is adapted to store a first data bit value within a first portion of the free layer of the MTJ stack 1106 that is adjacent to the first lateral electrode 1110, a second data bit value within a second portion of the free layer that is adjacent to the second lateral electrode 1112, and a third data bit value within a third portion of the free layer that is adjacent to the third lateral electrode 1350.

Figure 12:
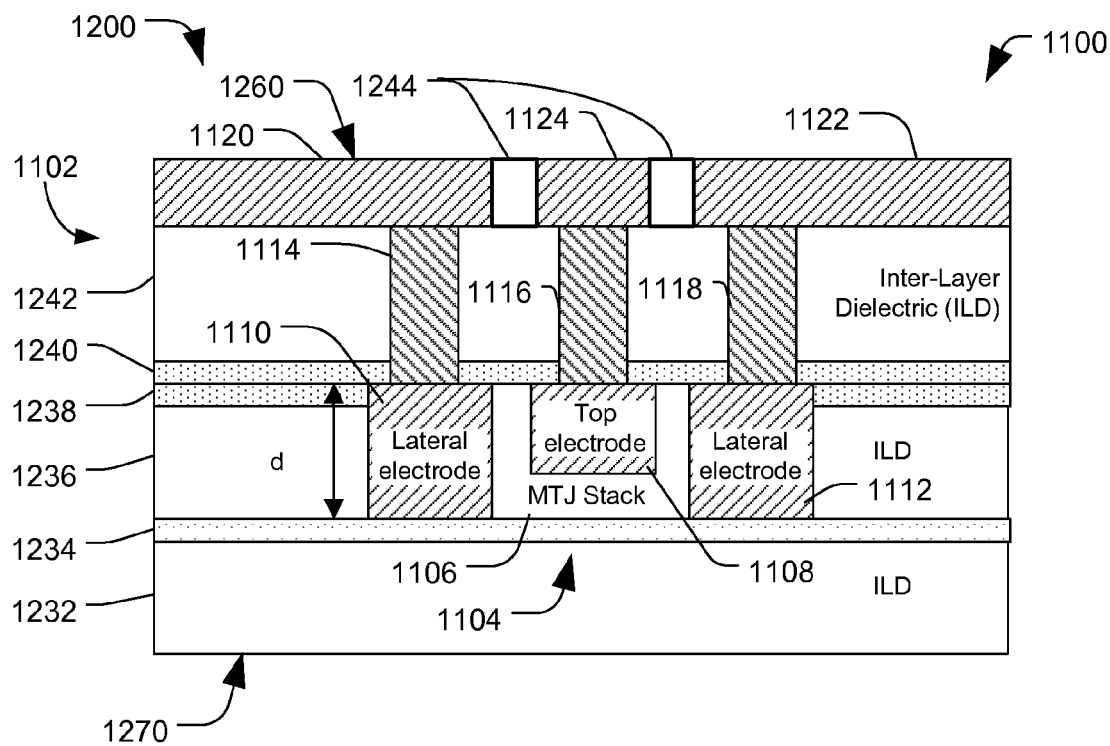
FIG. 12 is a cross-sectional diagram of the circuit device of FIG. 11 taken along line 12-12 in FIG. 11.
Figure 13:
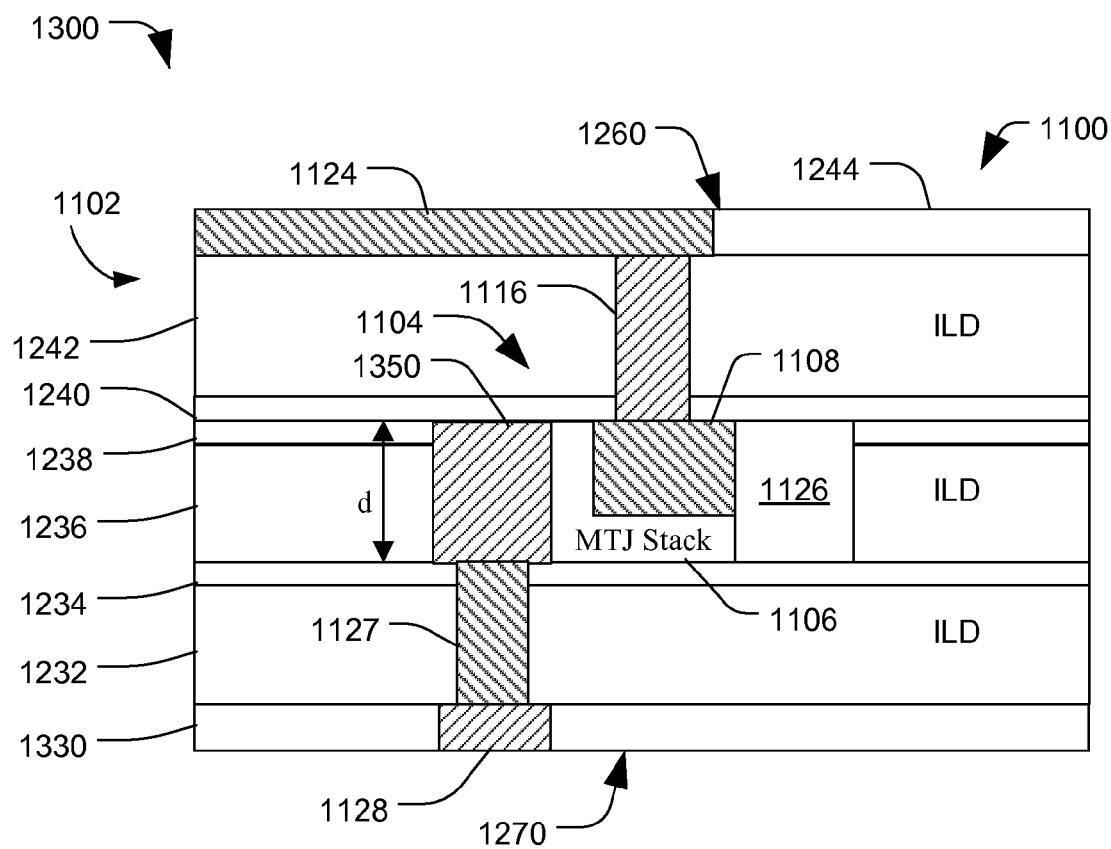
FIG. 13 is a cross-sectional diagram of the circuit device of FIG. 11 taken along line 13-13 in FIG. 11.

FIG. 12 is a cross-sectional diagram 1200 of the circuit device 1100 of FIG. 11 taken along line 12-12 in FIG. 11. The diagram 1200 illustrates the substrate 1102 including a second inter-layer dielectric layer 1232, a first cap layer 1234, a third inter-layer dielectric layer 1236, a second cap layer 1238, a third cap layer 1240, a fourth inter-layer dielectric layer 1242, and a fifth inter-layer dielectric layer 1244. The substrate 1102 includes a first surface 1260 and a second surface 1270. The substrate 1102 also includes the MTJ structure 1104 including the MTJ stack 1106. The first lateral electrode 1110, the second lateral electrode 1112, and the MTJ stack 1106 are disposed within a trench in the substrate 1102. The trench has a depth (d). The substrate 1102 includes the first, second, and third wire traces 1120, 1122, and 1124 deposited and patterned at the first surface 1260. The fourth wire trace 1128 is deposited and patterned at the second surface 1270 as illustrated in FIG. 13. The first wire trace 1120 is coupled to the first via 1114, which extends from the first wire trace 1120 to the first lateral electrode 1110. The second wire trace 1122 is coupled to the second via 1118, which extends from the second wire trace 1122 to the second lateral electrode 1112. The third wire trace 1124 is coupled to the center via 1116, which extends from the third wire trace 1124 to the center (top) electrode 1108. The center electrode 1108 is coupled to the MTJ stack 1106.

In general, the MTJ stack 1106 is adapted to store a first data bit value within a first portion of the free layer of the MTJ stack 1106 that is adjacent to the first lateral electrode 1110. The MTJ stack 1106 is also adapted to store a second data bit value within a second portion of the free layer of the MTJ stack 1106 that is adjacent to the second lateral electrode 1112. The MTJ stack 1106 is further adapted to store a third data bit value within a third portion of the free layer of the MTJ stack 1106 that is adjacent to the third lateral electrode 1350. A data bit value can be read from the MTJ stack 1106 by applying a voltage between the third wire trace 1124 and the first wire trace 1120, the second wire trace 1122, or the fourth wire trace 1128, and by comparing a current at the first wire trace 1120, the second wire trace 1122 or the fourth wire trace 1128 to a reference current. Alternatively, a data bit value may be written to the MTJ stack 1106 by applying a write current between the first, the second, or the fourth wire traces 1120, 1122, or 1128, and the third wire trace 1124. In a particular embodiment, the length (a) and the width (b) of the MTJ stack 1106 illustrated in FIG. 11 are greater than the depth (d), and respective magnetic domains carried by a free layer within the MTJ stack 1106 adjacent to the lateral electrodes 1110, 1112, or 1350 extend in a direction that is substantially parallel to the surface 1260 of the substrate 1102 in a direction of the width (b) or length (a) of the MTJ stack 1106 (i.e., into or out from the page view of FIG. 12). If the length (a) and width (b) of the MTJ stack 1106 are smaller than the depth (d), respective magnetic fields of free layer within the MTJ stack 1106 adjacent to the lateral electrodes 1110, 1112, and 1350 may be vertical along the trench depth direction.

FIG. 13 is a cross-sectional diagram 1300 of the circuit device 1100 of FIG. 11 taken along line 13-13 in FIG. 11. The diagram 1300 includes the substrate 1102 having a first inter-layer dielectric layer 1230, the second inter-layer dielectric layer 1232, the first cap layer 1234, the third inter-layer dielectric layer 1236, the second cap layer 1238, the third cap layer 1240, the fourth inter-layer dielectric layer 1242, and the fifth inter-layer dielectric layer 1244. The substrate 1102 includes the MTJ stack 1106, the top electrode 1108, and a center via 1116 that extends from the third wire trace 1124 to the top electrode 1108. The substrate 1102 also includes the process opening 1126, which may be formed by selectively removing a portion of the MTJ structure 1104 and filled by depositing an inter-layer dielectric material within the processing opening 1126. The substrate 1102 also includes the fourth wire trace 1128 coupled to the third via 1127, which extends from the fourth wire trace 1128 to a third lateral electrode 1350, which is coupled to the MTJ stack 1106.

In a particular illustrative embodiment, the MTJ structure 1104 is a substantially u-shaped structure including three sidewalls and a bottom wall. In the cross-sectional view of FIG. 13, the MTJ stack 1106 is an L-shaped structure. The MTJ structure 1104 can include lateral electrodes, such as the first, second, and third lateral electrodes 1110, 1112, and 1350, that are associated with respective sidewalls and can include a bottom electrode (not shown) that is associated with the bottom wall. Additionally, the MTJ structure 1104 is adapted to store up to four unique data bits.

Figure 14:
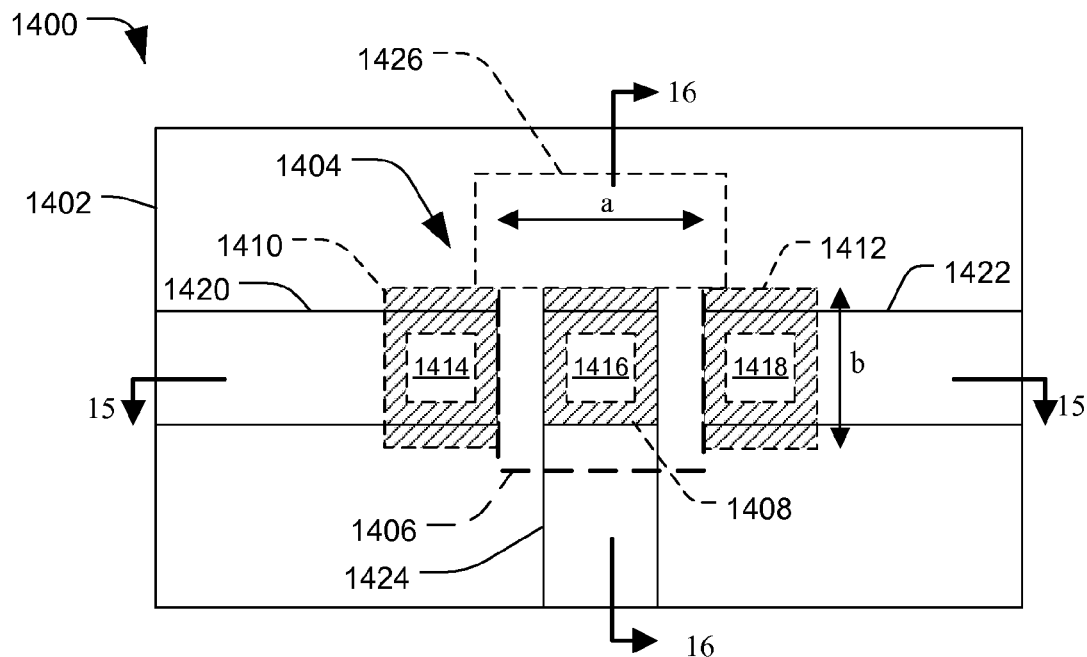
FIG. 14 is top view of a fifth particular illustrative embodiment of a circuit device including an MTJ cell having multiple lateral magnetic domains.

FIG. 14 is top view of a fifth particular illustrative embodiment of a circuit device 1400 including an MTJ cell having multiple lateral magnetic domains. The circuit device 1400 includes a substrate 1402. The substrate 1402 includes a magnetic tunnel junction (MTJ) structure 1404 that has an MTJ stack 1406, a center electrode 1408, a first lateral electrode 1410, and a second lateral electrode 1412. The MTJ stack 1406 has a length (a) and a width (b), where the length (a) is greater than the width (b). The substrate 1402 includes a first via 1414 coupled to the first lateral electrode 1410, a center via 1416 coupled to the center electrode 1408, and a second via 1418 coupled to the second lateral electrode 1412. The substrate 1402 also includes a first wire trace 1420 coupled to the first via 1414, a second wire trace 1422 coupled to the second via 1418, and a third wire trace 1424 coupled to the center via 1416. The substrate 1402 also includes a process opening 1426. In a particular embodiment, the MTJ structure 1404 is adapted to store a first data value within a first portion and a second data value within a second portion of a free layer of the MTJ stack 1406 that are adjacent to the first and second lateral electrodes 1410 and 1412, respectively.

Figure 15:
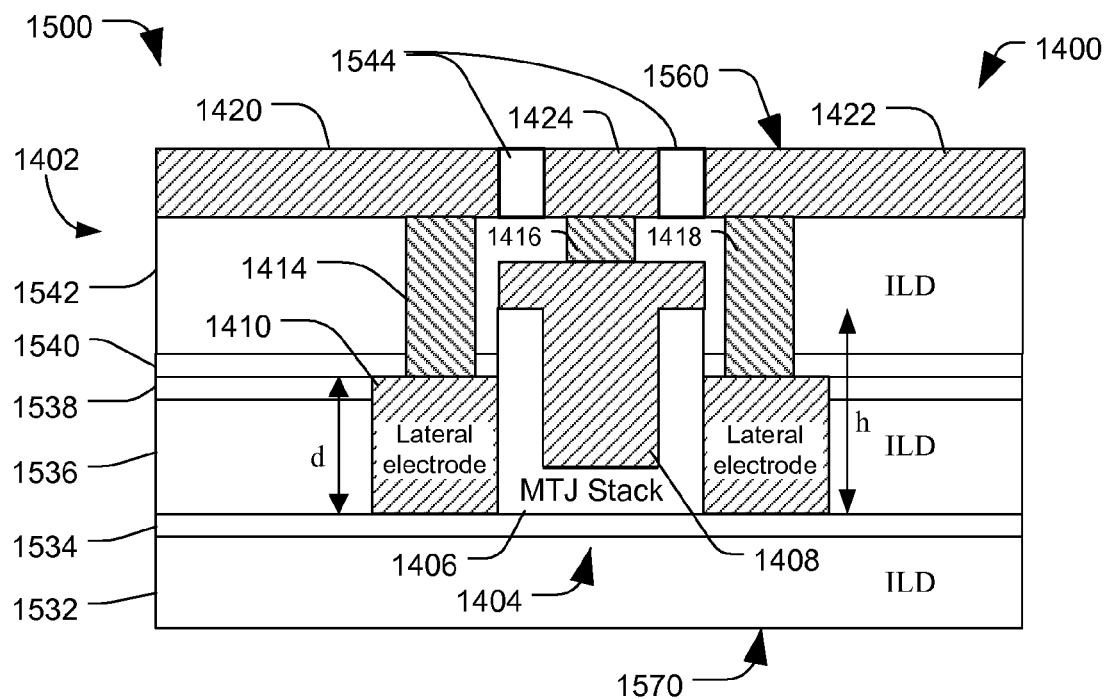
FIG. 15 is a cross-sectional diagram of the circuit device of FIG. 14 taken along line 15-15 in FIG. 14.

FIG. 15 is a cross-sectional diagram 1500 of the circuit device 1400 of FIG. 14 taken along line 15-15 in FIG. 14. The diagram 1500 illustrates the substrate 1402 including a first inter-layer dielectric layer 1532, a first cap layer 1534, a second inter-layer dielectric layer 1536, a second cap layer 1538, a third cap layer 1540, a third inter-layer dielectric layer 1542, and a fourth inter-layer dielectric layer 1544. The substrate 1402 includes a first surface 1560 and a second surface 1570. The substrate 1402 also includes the MTJ structure 1404 including the MTJ stack 1406. The first lateral electrode 1410, the second lateral electrode 1412, and the MTJ stack 1406 are disposed within a trench in the substrate 1402. The trench has a depth (d). In this embodiment, the MTJ stack 1406 can be formed using a deposition and photo-etch process to selectively remove portions of the MTJ stack 1406. In general, a photo-etch process may be used to remove extra MTJ film and define a MTJ pattern in the illustrative embodiments depicted in FIGS. 14-25.

The substrate 1402 includes the first, second and third wire traces 1420, 1422, and 1424 deposited and patterned at the first surface 1560. The first wire trace 1420 is coupled to the first via 1414, which extends from the first wire trace 1420 to the first lateral electrode 1410. The second wire trace 1422 is coupled to the second via 1418, which extends from the second wire trace 1422 to the second lateral electrode 1412. The third wire trace 1424 is coupled to the center via 1416, which extends from the third wire trace 1424 to the center (top) electrode 1408. The center electrode 1408 is coupled to the MTJ stack 1406.

In general, the MTJ stack 1406 is adapted to store a first data value within a first portion of a free layer of the MTJ stack 1406 that is adjacent to the first lateral electrode 1410. The MTJ stack 1406 is also adapted to store a second data value within a second portion of the free layer of the MTJ stack 1406 that is adjacent to the second lateral electrode 1412. A data value can be read from the MTJ stack 1406 by applying a voltage between the third wire trace 1424 and the first wire trace 1420 or the second wire trace 1422 and by comparing a current at the first wire trace 1420 or the second wire trace 1422 to a reference current. Alternatively, a data value may be written to the MTJ stack 1406 by applying a write current between the first wire trace 1420 or the second wire trace 1422 and the third wire trace 1424. In a particular embodiment, the length (a) and the width (b) of the MTJ stack 1406 illustrated in FIG. 14 are greater than the height of the MTJ stack and the depth (d), and respective magnetic domains carried by a free layer within the MTJ stack 1406 adjacent to the lateral electrodes 1410 and 1412 extend in a direction that is substantially parallel to the surface of the substrate 1560 in a direction of the width (b) of the MTJ stack 1406 (i.e., into or out from the page view of FIG. 15).

In a particular embodiment, the MTJ stack 1406 has a height (h) that is greater than the length (a) or the width (b). In this instance, respective magnetic domains carried by a free layer within the MTJ stack 1406 adjacent to the lateral electrodes 1410 and 1412 extend in a direction that is substantially perpendicular to the surface 1560 of the substrate 1402 in a direction of the depth (d) of the MTJ stack, 1406.

Figure 16:
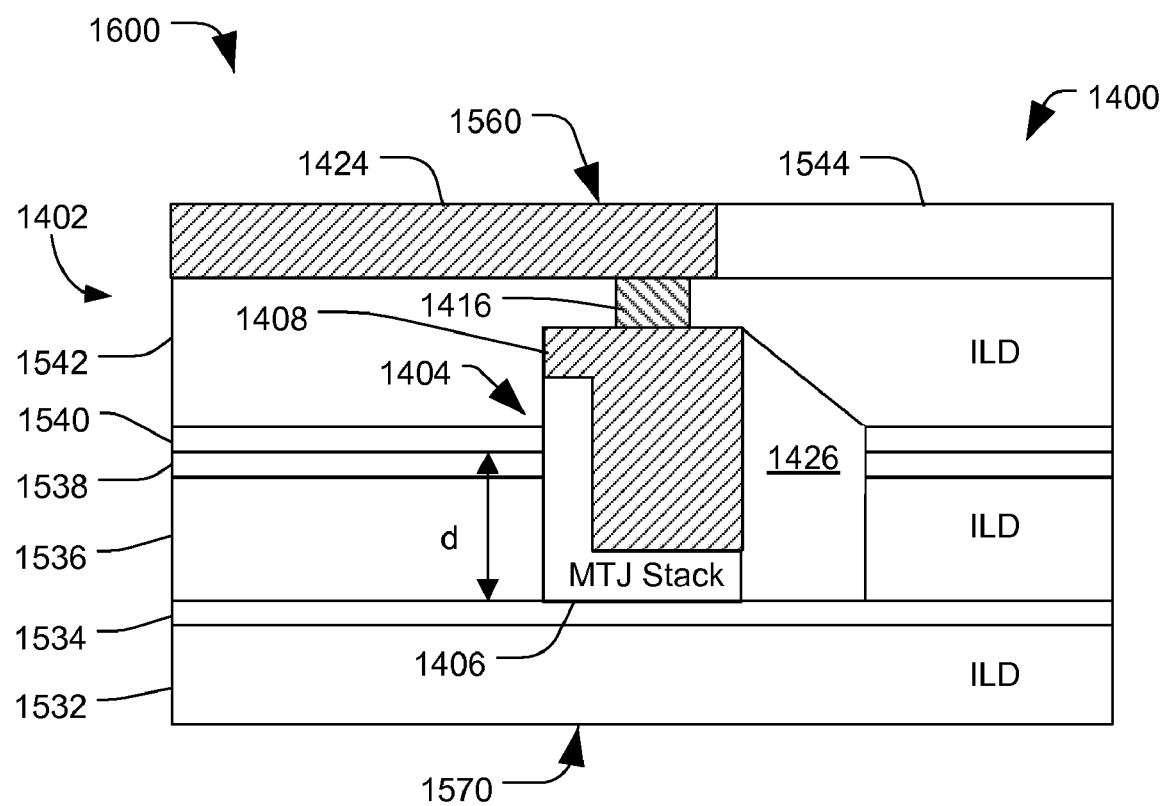
FIG. 16 is a cross-sectional diagram of the circuit device of FIG. 14 taken along line 16-16 in FIG. 14.

FIG. 16 is a cross-sectional diagram 1600 of the circuit device 1400 of FIG. 14 taken along line 16-16 in FIG. 14. The diagram 1600 includes the substrate 1402 having the first inter-layer dielectric layer 1532, the first cap layer 1534, the second inter-layer dielectric layer 1536, the second cap layer 1538, the third cap layer 1540, the third inter-layer dielectric layer 1542, and the fourth inter-layer dielectric layer 1544. The substrate 1402 includes the MTJ stack 1406, the top electrode 1408, and a center via 1416 that extends from the third wire trace 1424 to the top electrode 1408. The substrate 1402 also includes the process opening 1426, which may be formed by selectively removing a portion of the MTJ structure 1404 and filled by depositing an inter-layer dielectric material within the processing opening 1426.

In a particular illustrative embodiment, the MTJ structure 1404 is a substantially u-shaped structure including three sidewalls and a bottom wall. The MTJ structure 1404 can include lateral electrodes, such as the first and second lateral electrodes 1410 and 1412, that are associated with respective sidewalls and can include a bottom electrode that is associated with the bottom wall. Additionally, the MTJ structure 1404 is adapted to store up to four unique data bits.

Figure 17:
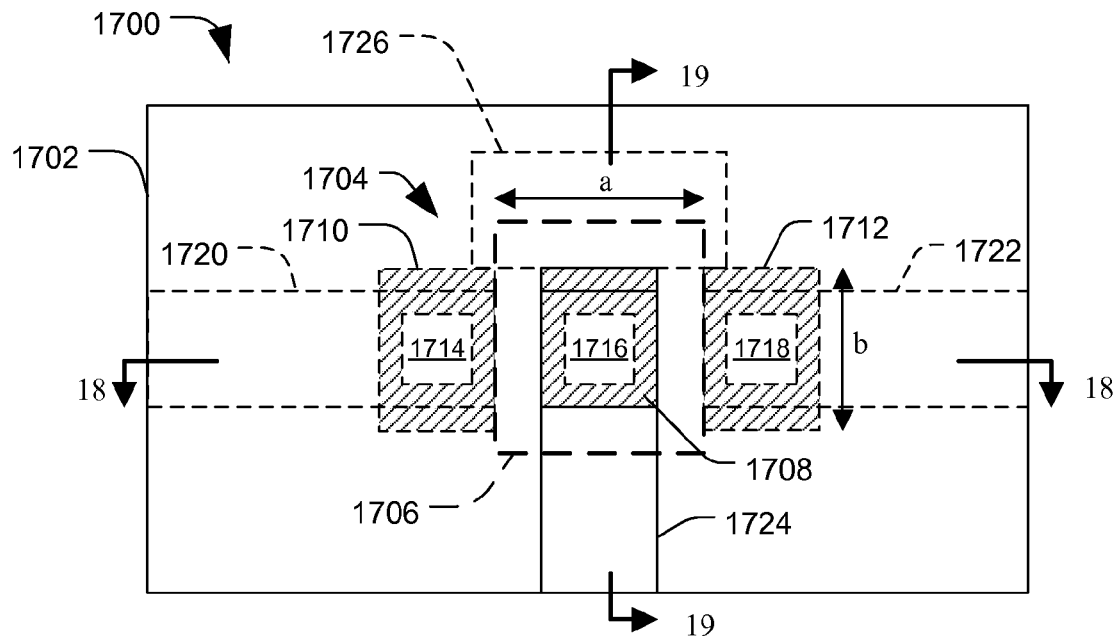
FIG. 17 is top view of a sixth particular illustrative embodiment of a circuit device including an MTJ cell having multiple lateral magnetic domains.

FIG. 17 is top view of a sixth particular illustrative embodiment of a circuit device 1700 including an MTJ cell having multiple lateral magnetic domains. The circuit device 1700 includes a substrate 1702. The substrate 1702 includes a magnetic tunnel junction (MTJ) structure 1704 that has an MTJ stack 1706, a center electrode 1708, a first lateral electrode 1710, and a second lateral electrode 1712. The MTJ stack 1706 has a length (a) and a width (b), where the length (a) is greater than the width (b). The substrate 1702 includes a first via 1714 coupled to the first lateral electrode 1710, a center via 1716 coupled to the center electrode 1708, and a second via 1718 coupled to the second lateral electrode 1712. The substrate 1702 also includes a first wire trace 1720 coupled to the first via 1714, a second wire trace 1722 coupled to the second via 1718, and a third wire trace 1724 coupled to the center via 1716. The substrate 1702 also includes a process opening 1726. In a particular embodiment, the MTJ structure 1704 is adapted to store a first data value within a first portion and a second data value within a second portion of a free layer of the MTJ stack 1706 that are adjacent to the first and second lateral electrodes 1710 and 1712, respectively.

Figure 18:
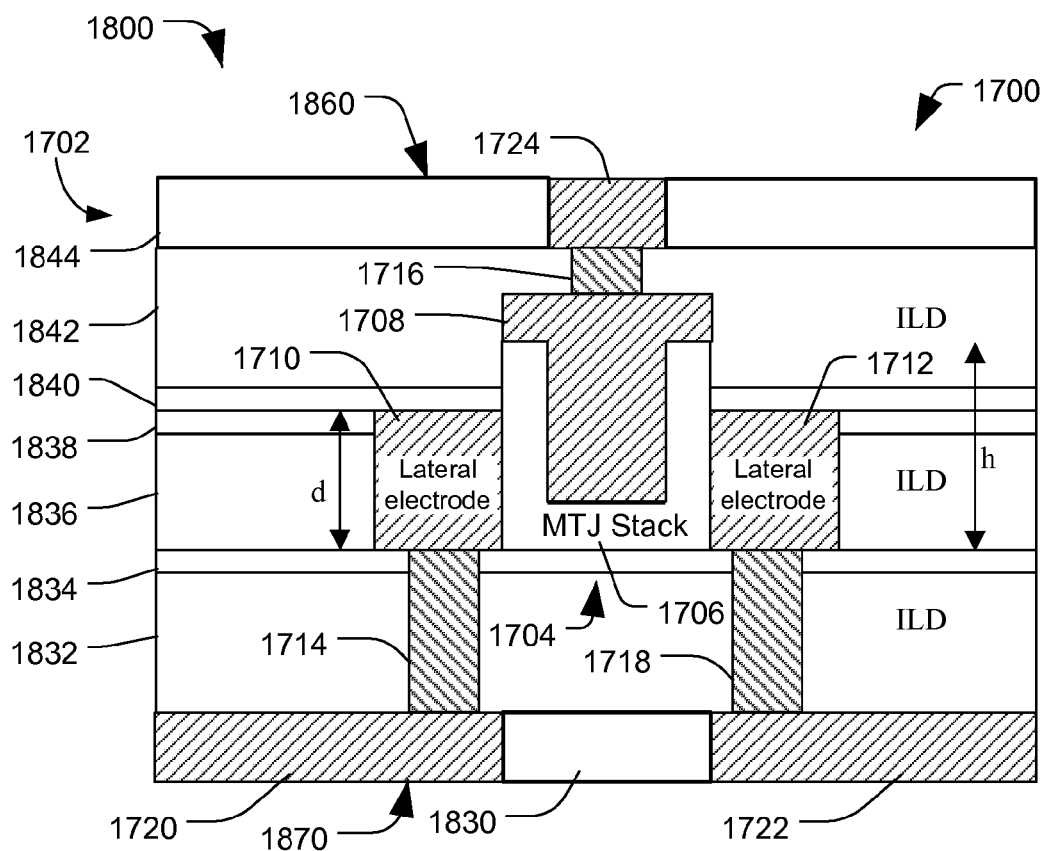
FIG. 18 is a cross-sectional diagram of the circuit device of FIG. 17 taken along line 18-18 in FIG. 17.

FIG. 18 is a cross-sectional diagram 1800 of the circuit device 1700 of FIG. 17 taken along line 18-18 in FIG. 17. The diagram 1800 illustrates the substrate 1702 including a first inter-layer dielectric layer 1830 and 1832, a first cap layer 1834, a second inter-layer dielectric layer 1836, a second cap layer 1838, a third cap layer 1840, a third inter-layer dielectric layer 1842, and a fourth inter-layer dielectric layer 1844. The substrate 1702 includes a first surface 1860 and a second surface 1870. The substrate 1702 also includes the MTJ structure 1704 including the MTJ stack 1706. The first lateral electrode 1710, the second lateral electrode 1712, and the MTJ stack 1706 are disposed within a trench in the substrate 1702. The trench has a depth (d), and the MTJ stack 1706 has a height (h) that is greater than the trench depth (d). The substrate 1702 includes the first and second wire traces 1720 and 1722 deposited and patterned at the second surface 1870, and the third wire trace 1724 deposited and patterned at the first surface 1860. The first wire trace 1720 is coupled to the first via 1714, which extends from the first wire trace 1720 to the first lateral electrode 1710. The second wire trace 1722 is coupled to the second via 1718, which extends from the second wire trace 1722 to the second lateral electrode 1712. The third wire trace 1724 is coupled to the center via 1716, which extends from the third wire trace 1724 to the center (top) electrode 1708. The center electrode 1708 is coupled to the MTJ stack 1706.

In general, the MTJ stack 1706 is adapted to store a first data value within a first portion of a free layer of the MTJ stack 1706 that is adjacent to the first lateral electrode 1710. The MTJ stack 1706 is also adapted to store a second data value within a second portion of the free layer of the MTJ stack 1706 that is adjacent to the second lateral electrode 1712. A data value can be read from the MTJ stack 1706 by applying a voltage between the third wire trace 1724 and the first wire trace 1720 or the second wire trace 1722 and by comparing a current at the first wire trace 1720 or the second wire trace 1722 to a reference current. Alternatively, a data value may be written to the MTJ stack 1706 by applying a write current between the first wire trace 1720 or the second wire trace 1722 and third wire trace 1724. In a particular embodiment, the length (a) and the width (b) of the MTJ stack 1706 are greater than the height (h) of the MTJ stack 1706, and respective magnetic domains carried by a free layer within the MTJ stack 1706 adjacent to the lateral electrodes 1710 and 1712 extend in a direction that is substantially parallel to the surface 1860 of the substrate 1702 in a direction of the width (b) of the MTJ stack 1706 (i.e., into or out from the page view of FIG. 18). In another particular embodiment, the height (h) of the MTJ stack 1706 can be greater than the length (a) or the width (b) and the magnetic domains carried by the free layer within the MTJ stack 1706 adjacent to the lateral electrodes 1710 and 1712 extend in a direction that is substantially perpendicular to the surface 1860 of the substrate 1702.

Figure 19:
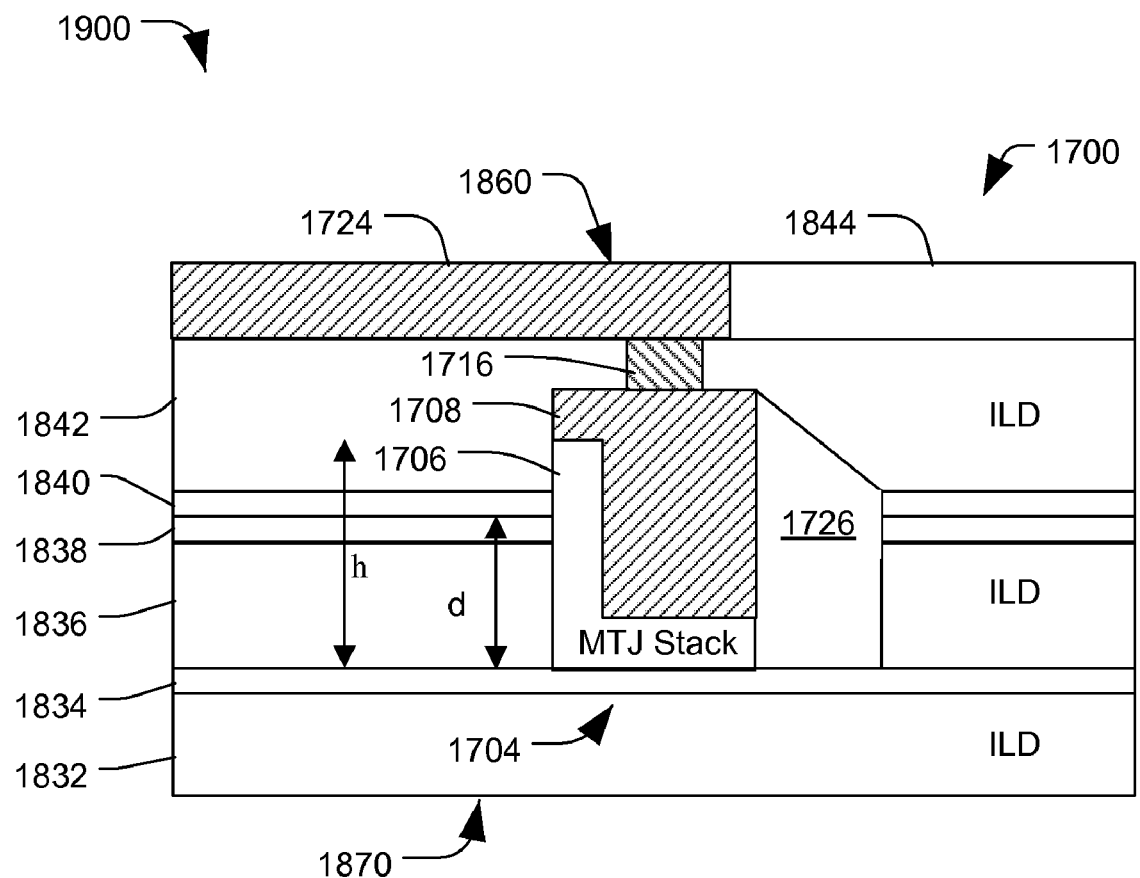
FIG. 19 is a cross-sectional diagram of the circuit device of FIG. 17 taken along line 19-19 in FIG. 17.

FIG. 19 is a cross-sectional diagram 1900 of the circuit device 1700 of FIG. 17 taken along line 19-19 in FIG. 19. The diagram 1900 includes the substrate 1702 having the first inter-layer dielectric layer 1832, the first cap layer 1834, the second inter-layer dielectric layer 1836, the second cap layer 1838, the third cap layer 1840, the third inter-layer dielectric layer 1842, and the fourth inter-layer dielectric layer 1844. The substrate 1702 includes the MTJ stack 1706, the top electrode 1708, and a center via 1716 that extends from the third wire trace 1724 to the top electrode 1708. The substrate 1702 also includes the process opening 1726, which may be formed by selectively removing a portion of the MTJ structure 1704 and filled by depositing an inter-layer dielectric material within the processing opening 1726.

In a particular illustrative embodiment, the MTJ structure 1704 is a substantially u-shaped structure including three sidewalls and a bottom wall. The MTJ structure 1704 can include lateral electrodes, such as the first and second lateral electrodes 1710 and 1712, that are associated with respective sidewalls and can include a bottom electrode that is associated with the bottom wall. Additionally, the MTJ structure 1704 is adapted to store up to four unique data bits.

Figure 20:
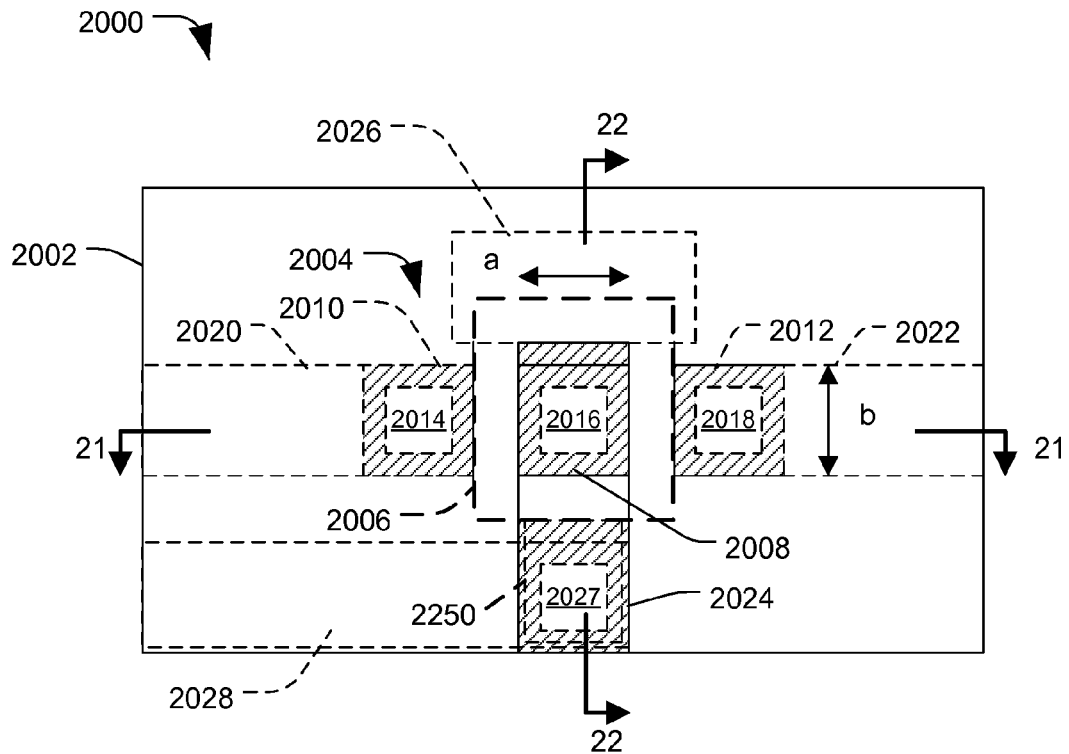
FIG. 20 is top view of a seventh particular illustrative embodiment of a circuit device including an MTJ cell having multiple lateral magnetic domains.

FIG. 20 is top view of a seventh particular illustrative embodiment of a circuit device 2000 including an MTJ cell having multiple lateral magnetic domains. The circuit device 2000 includes a substrate 2002. The substrate 2002 includes a magnetic tunnel junction (MTJ) structure 2004 that has an MTJ stack 2006, a center electrode 2008, a first lateral electrode 2010, and a second lateral electrode 2012. The MTJ stack 2006 has a length (a) and a width (b), where the length (a) is greater than the width (b). The substrate 2002 includes a first via 2014 coupled to the first lateral electrode 2010, a center via 2016 coupled to the center electrode 2008, a second via 2018 coupled to the second lateral electrode 2012, and a third via 2027 coupled to a third lateral electrode 2250 depicted in FIG. 22. The substrate 2002 also includes a first wire trace 2020 coupled to the first via 2014, a second wire trace 2022 coupled to the second via 2018, and a third wire trace 2024 coupled to the center via 2016. The substrate 2002 also includes a process opening 2026. The substrate 2002 includes a third via 2027 and a fourth wire trace 2028. In a particular embodiment, the MTJ structure 2004 is adapted to store a first data value, a second data value, and a third data value within respective portions of a free layer of the MTJ stack 2006 that are adjacent to the first, the second, and the third lateral electrodes 2010, 2012, and 2250.

Figure 21:
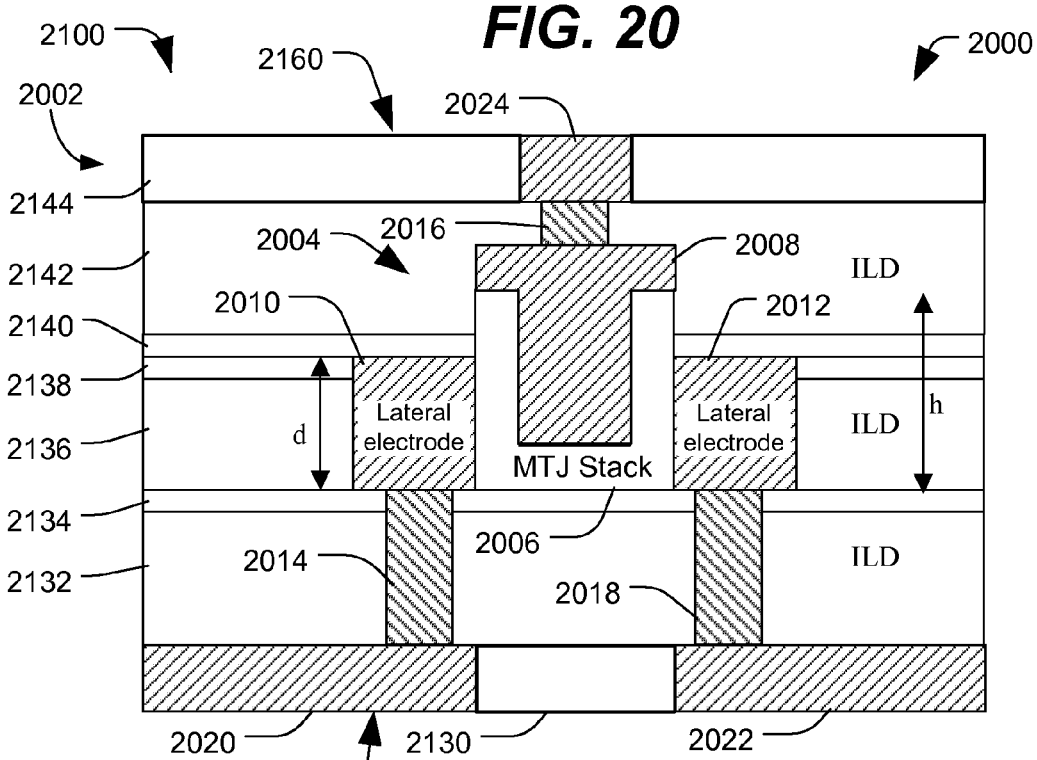
FIG. 21 is a cross-sectional diagram of the circuit device of FIG. 20 taken along line 21-21 in FIG. 20.
Figure 22:
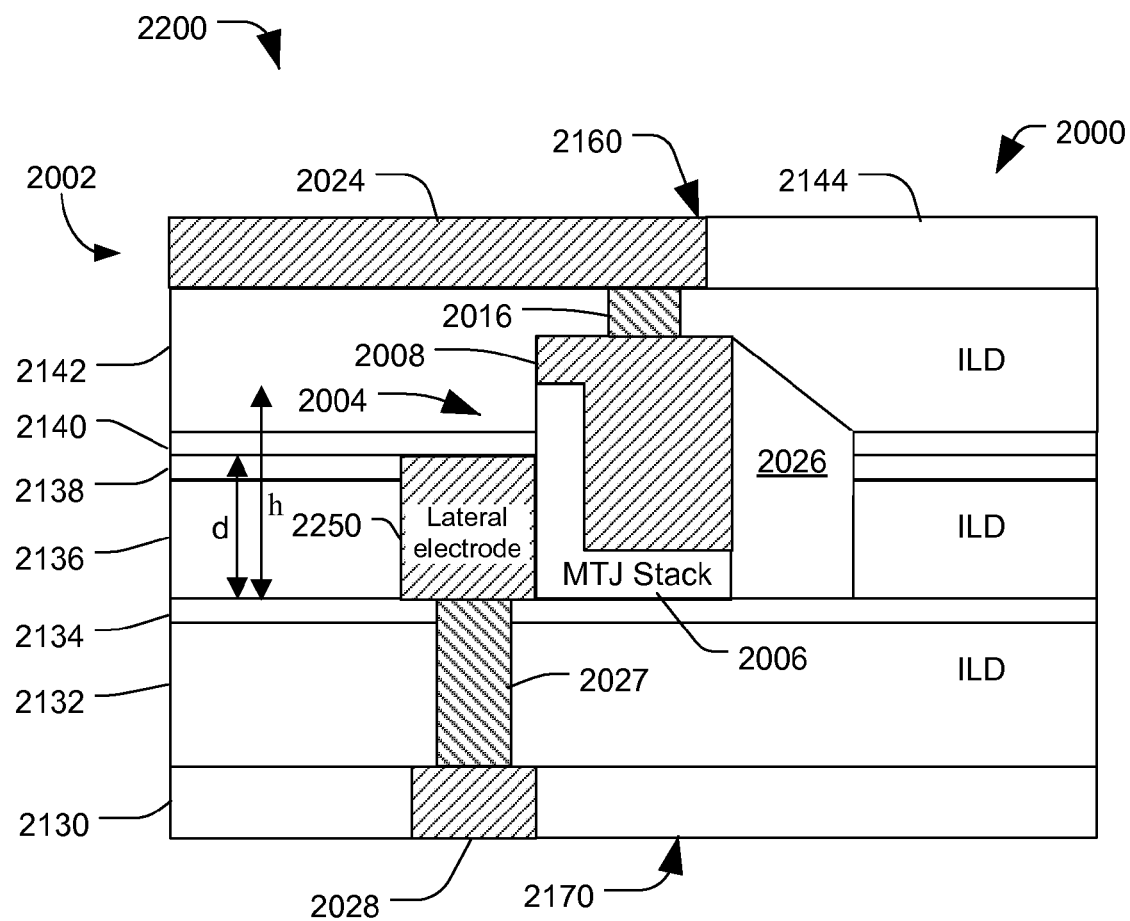
FIG. 22 is a cross-sectional diagram of the circuit device of FIG. 20 taken along line 22-22 in FIG. 20.

FIG. 21 is a cross-sectional diagram 2100 of the circuit device 2000 of FIG. 20 taken along line 21-21 in FIG. 20. The diagram 2100 illustrates the substrate 2002 including a first inter-layer dielectric layer 2130, a second inter-layer dielectric layer 2132, a first cap layer 2134, a third inter-layer dielectric layer 2136, a second cap layer 2138, a third cap layer 2140, a fourth inter-layer dielectric layer 2142, and a fifth inter-layer dielectric layer 2144. The substrate 2002 includes a first surface 2160 and a second surface 2170. The substrate 2002 also includes the MTJ structure 2004 including the MTJ stack 2006. The first lateral electrode 2010, the second lateral electrode 2012, and the MTJ stack 2006 are disposed within a trench in the substrate 2002. The trench has a depth (d). The MTJ stack 2006 has a height (h) that is greater than the trench depth (d). The substrate 2002 includes the first and second wire traces 2020 and 2022 at the second surface 2170, and the third wire trace 2024 at the first surface 2160. The fourth wire trace 2028 is also deposited and patterned at the second surface 2170 (as shown in FIG. 22). The first wire trace 2020 is coupled to the first via 2014, which extends from the first wire trace 2020 to the first lateral electrode 2010. The second wire trace 2022 is coupled to the second via 2018, which extends from the second wire trace 2022 to the second lateral electrode 2012. The third wire trace 2024 is coupled to the center via 2016, which extends from the third wire trace 2024 to the center (top) electrode 2008. The center electrode 2008 is coupled to the MTJ stack 2006.

In general, the MTJ stack 2006 is adapted to store a first data value within a first portion of a free layer of the MTJ stack 2006 that is adjacent to the first lateral electrode 2010. The MTJ stack 2006 is also adapted to store a second data value within a second portion of the free layer of the MTJ stack 2006 that is adjacent to the second lateral electrode 2012. A data value can be read from the MTJ stack 2006 by applying a voltage between the third wire trace 2024 and the first wire trace 2020, the second wire trace 2022, or the fourth wire trace 2250, and by comparing a current at the first wire trace 2020, the second wire trace 2022, or the fourth wire trace 2250 to a reference current. Alternatively, a data value may be written to the MTJ stack 2006 by applying a write current between the first wire trace 2020, the second wire trace 2022 or the fourth wire trace 2250 and the third wire trace 2024. In a particular embodiment, the length (a) and the width (b) of the MTJ stack 2006 illustrated in FIG. 20 are greater than the height (h), and respective magnetic domains carried by a free layer within the MTJ stack 2006 adjacent to the lateral electrodes 2010 and 2012 extend in a direction that is substantially parallel to the surface 2160 of the substrate 2002 in a direction of the width (b) of the MTJ stack 2006 (i.e., into or out from the page view of FIG. 21). In another particular embodiment, the height (h) of the MTJ stack 2006 can be greater than the length (a) or the width (b) and the magnetic domains carried by the free layer within the MTJ stack 2006 adjacent to the lateral electrodes 2110 and 2112 extend in a direction that is substantially perpendicular to the surface 2160 of the substrate 2002

FIG. 22 is a cross-sectional diagram 2200 of the circuit device 2000 of FIG. 20 taken along line 22-22 in FIG. 20. The diagram 2200 includes the substrate 2002 having the first inter-layer dielectric layer 2130, the second inter-layer dielectric layer 2132, the first cap layer 2134, the third inter-layer dielectric layer 2136, the second cap layer 2138, the third cap layer 2140, the fourth inter-layer dielectric layer 2142, and the fifth inter-layer dielectric layer 2144. The substrate 2002 includes the MTJ stack 2006, the top electrode 2008, and a center via 2016 that extends from the third wire trace 2024 to the top electrode 2008. The substrate 2002 also includes the process opening 2026, which may be formed by selectively removing a portion of the MTJ structure 2004 and filled by depositing an inter-layer dielectric material within the processing opening 2026. The substrate 2002 also includes the fourth wire trace 2028 deposited and patterned at the second surface 2170. The fourth wire trace 2028 is coupled to the third via 2027, which extends from the fourth wire trace 2028 to a third lateral electrode 2250, which is coupled to the MTJ stack 2006.

In a particular illustrative embodiment, the MTJ structure 2004 is a substantially u-shaped structure including three sidewalls and a bottom wall. In the cross-sectional view of FIG. 22, the MTJ stack 2006 is an L-shaped structure. The MTJ structure 2004 can include lateral electrodes, such as the first, second, and third lateral electrodes 2010, 2012, and 2250, that are associated with respective sidewalls and can include a bottom electrode (not shown) that is associated with the bottom wall. Additionally, the MTJ structure 2004 is adapted to store up to four unique data bits.

Figure 23:
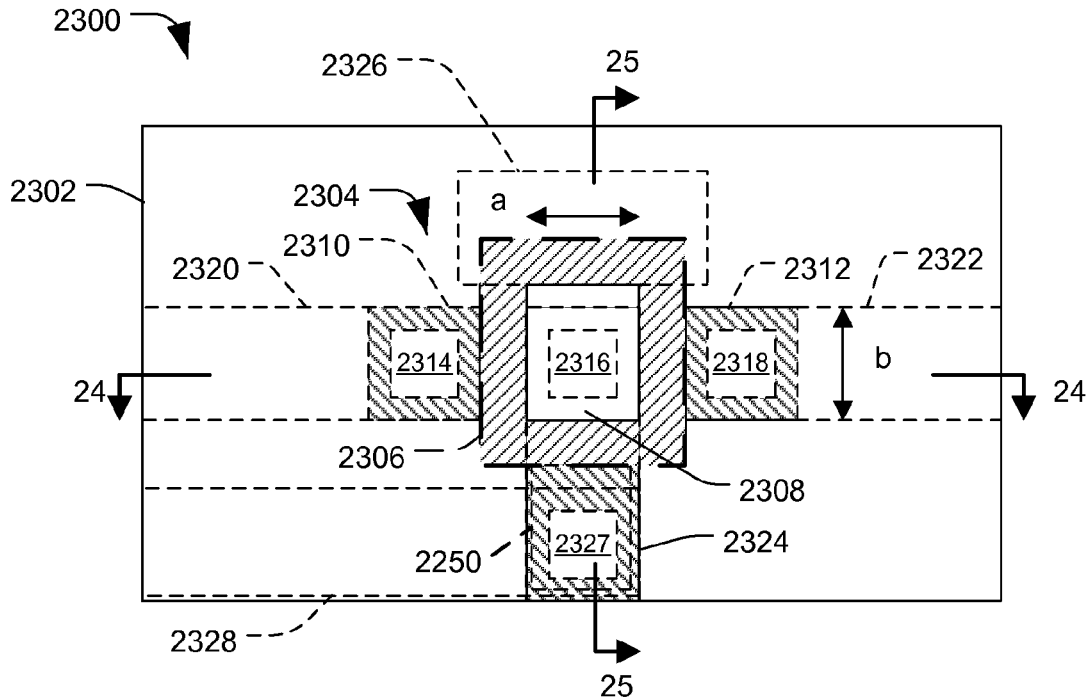
FIG. 23 is top view of a eighth particular illustrative embodiment of a circuit device including an MTJ cell having multiple lateral magnetic domains.

FIG. 23 is top view of an eighth particular illustrative embodiment of a circuit device 2300 including an MTJ cell having multiple lateral magnetic domains. The circuit device 2300 includes a substrate 2302. The substrate 2302 includes a magnetic tunnel junction (MTJ) structure 2304 that has an MTJ stack 2306, a center electrode 2308, a first lateral electrode 2310, and a second lateral electrode 2312. The MTJ stack 2306 has a length (a) and a width (b), where the length (a) is greater than the width (b). The substrate 2302 includes a first via 2314 coupled to the first lateral electrode 2310, a center via 2316 coupled to the center electrode 2308, and a second via 2318 coupled to the second lateral electrode 2312. The substrate 2302 also includes a first wire trace 2320 coupled to the first via 2314, a second wire trace 2322 coupled to the second via 2318, and a third wire trace 2324 coupled to the center via 2316. The substrate 2302 also includes a process opening 2326. The substrate 2302 includes a third via 2327 and a fourth wire trace 2328. In a particular embodiment, the MTJ structure 2304 is adapted to store a first data value, a second data value, and a third data value within portions of a free layer of the MTJ stack 2306 that are adjacent to the first, second, and a third lateral electrodes 2310, 2312, and 2550, respectively.

Figure 24:
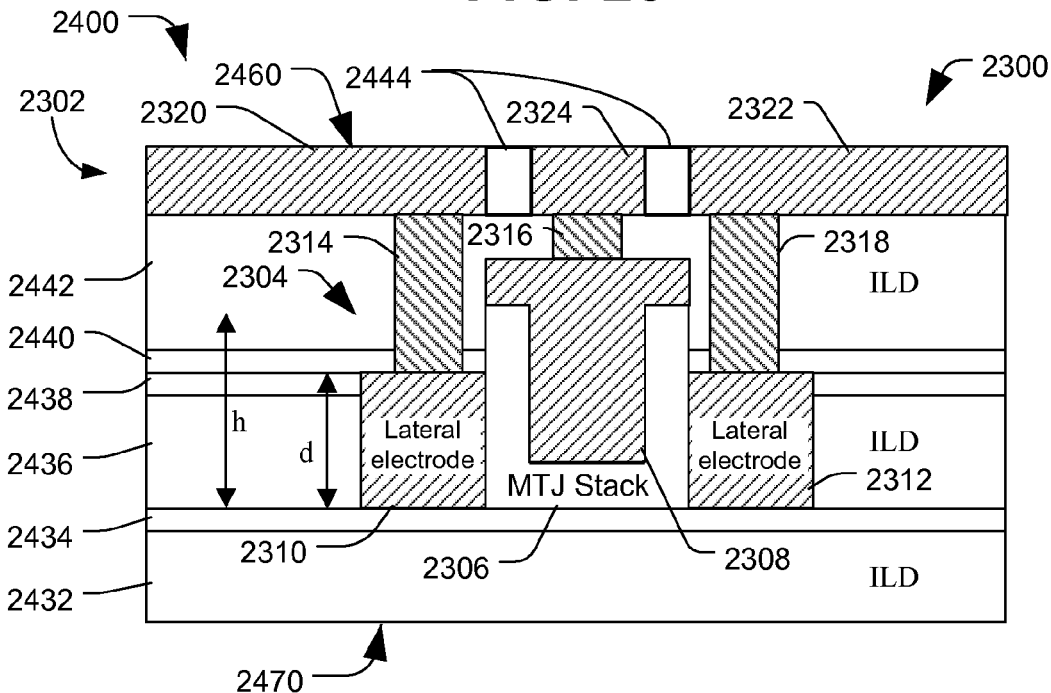
FIG. 24 is a cross-sectional diagram of the circuit device of FIG. 23 taken along line 24-24 in FIG. 23.

FIG. 24 is a cross-sectional diagram 2400 of the circuit device 2300 of FIG. 23 taken along line 24-24 in FIG. 23. The diagram 2400 illustrates the substrate 2302 including a first inter-layer dielectric layer 2430, a second inter-layer dielectric layer 2432, a first cap layer 2434, a third inter-layer dielectric layer 2436, a second cap layer 2438, a third cap layer 2440, a fourth inter-layer dielectric layer 2442, and a fifth inter-layer dielectric layer 2444. The substrate 2302 includes a first surface 2460 and a second surface 2470. The substrate 2302 also includes the MTJ structure 2304 including the MTJ stack 2306. The first lateral electrode 2310, the second lateral electrode 2312, and the MTJ stack 2306 are disposed within a trench in the substrate 2302. The trench has a depth (d). The substrate 2302 includes the first, second, and third wire traces 2320, 2322, and 2324 disposed at the first surface 2460. The fourth wire trace 2328 is disposed at the second surface 2470 (depicted in FIG. 25). The first wire trace 2320 is coupled to the first via 2314, which extends from the first wire trace 2320 to the first lateral electrode 2310. The second wire trace 2322 is coupled to the second via 2318, which extends from the second wire trace 2322 to the second lateral electrode 2312. The third wire trace 2324 is coupled to the center via 2316, which extends from the third wire trace 2324 to the center (top) electrode 2308. The center electrode 2308 is coupled to the MTJ stack 2306.

In general, the MTJ stack 2306 is adapted to store a first data value within a first portion of a free layer of the MTJ stack 2306 that is adjacent to the first lateral electrode 2310. The MTJ stack 2306 is also adapted to store a second data value within a second portion of the free layer of the MTJ stack 2306 that is adjacent to the second lateral electrode 2312. The MTJ stack 2306 is also adapted to store a third data value within a third portion of the free layer of the MTJ stack 2306 that is adjacent to the third lateral electrode 2550. A data value can be read from the MTJ stack 2306 by applying a voltage between the third wire trace 2324 and the first wire trace 2320, the second wire trace 2322, or the fourth wire trace 2328 and by comparing a current at the first wire trace 2320, the second wire trace 2322, or the fourth wire trace 2328 to a reference current. Alternatively, a data value may be written to the MTJ stack 2306 by applying a write current between the first wire trace 2320, the second wire trace 2322, or the fourth wire trace 2328 and third wire trace 2324. In a particular embodiment, the length (a) and the width (b) of the MTJ stack 2306 illustrated in FIG. 23 are greater than the height (h), and respective magnetic domains carried by a free layer within the MTJ stack 2306 adjacent to the lateral electrodes 2310 and 2312 extend in a direction that is substantially parallel to the surface 2460 of the substrate 2302 in a direction of the width (b) of the MTJ stack 2306 (i.e., into or out from the page view). In another particular embodiment, the height (h) of the MTJ stack 2306 can be greater than the length (a) or the width (b) and the magnetic domains carried by the free layer within the MTJ stack 2306 adjacent to the lateral electrodes 2310 and 2312 extend in a direction that is substantially perpendicular to the surface 2460 of the substrate 2302

Figure 25:
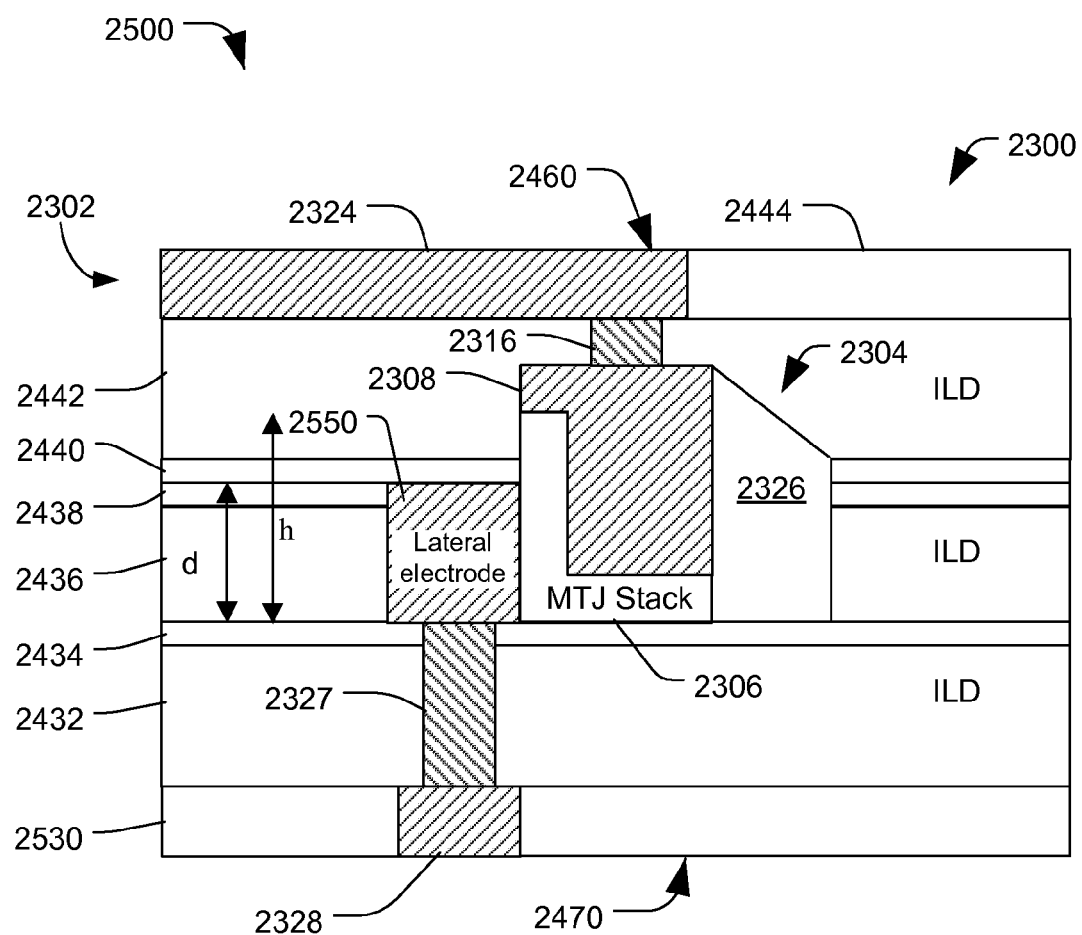
FIG. 25 is a cross-sectional diagram of the circuit device of FIG. 23 taken along line 25-25 in FIG. 23.

FIG. 25 is a cross-sectional diagram 2500 of the circuit device 2300 of FIG. 23 taken along line 25-25 in FIG. 23. The diagram 2500 includes the substrate 2302 having the first inter-layer dielectric layer 2430, the second inter-layer dielectric layer 2432, the first cap layer 2434, the third inter-layer dielectric layer 2436, the second cap layer 2438, the third cap layer 2440, the fourth inter-layer dielectric layer 2442, and the fifth inter-layer dielectric layer 2444. The substrate 2302 includes the MTJ stack 2306, the top electrode 2308, and a center via 2316 that extends from the third wire trace 2324 to the top electrode 2308. The substrate 2302 also includes the process opening 2326, which may be formed by selectively removing a portion of the MTJ structure 2304 and filled by depositing an inter-layer dielectric material within the processing opening 2326. The substrate 2302 also includes the fourth wire trace 2328 coupled to the third via 2327, which extends from the fourth wire trace 2328 to a third lateral electrode 2550, which is coupled to the MTJ stack 2306.

In a particular illustrative embodiment, the MTJ structure 2304 is a substantially u-shaped structure including three sidewalls and a bottom wall. In the cross-sectional view of FIG. 25, the MTJ stack 2306 is an L-shaped structure. The MTJ structure 2304 can include lateral electrodes, such as the first, second, and third lateral electrodes 2310, 2312, and 2550, that are associated with respective sidewalls and can include a bottom electrode (not shown) that is associated with the bottom wall. Additionally, the MTJ structure 2304 is adapted to store up to four unique data bits.

Figure 26:
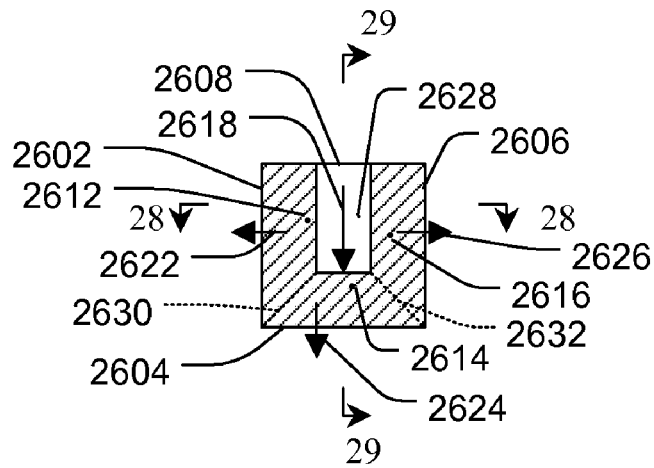
FIG. 26 is a top view of a free layer of an MTJ cell having multiple lateral magnetic domains configured in a zero-value state.

FIG. 26 is a top view of a free layer 2600 of an MTJ cell having multiple lateral magnetic domains configured in a zero-value state. In this example, the free layer 2600 is illustrated in a bit-zero state, where each of the bits represents a zero value. The free layer 2600 includes a first sidewall 2602, a second sidewall 2604, a third sidewall 2606, and a bottom wall 2608. The free layer 2600 of each of the sidewalls 2602, 2604, and 2606 and of the bottom wall 2608 carry unique magnetic domains configured to represent a data value, such as a "1" or a "0" value. The first sidewall 2602 carries a first magnetic domain 2612. The second sidewall 2604 carries a second magnetic domain 2614. The third sidewall 2606 carries a third magnetic domain 2616. The bottom wall 2608 carries a fourth magnetic domain 2618. The magnetic domains 2612, 2614, and 2616 extend out from the page view as indicated by the dots (i.e., an arrow head). In this particular instance, a depth of each of the sidewalls 2602, 2604, and 2606 is greater than a respective length or width of each of the sidewalls 2602, 2604, and 2606. Accordingly, the magnetic domains 2612, 2614, and 2616 are oriented in a direction of the depth.

The first magnetic domain 2612 of the first sidewall 2602 is separated from the second magnetic domain 2614 of the second sidewall 2604 by a first domain barrier 2630. Similarly, the second magnetic domain 2614 of the second sidewall 2604 is separated from the third magnetic domain 2616 of the third sidewall 2606 by a second domain barrier 2632.

In general, the first domain barrier 2630 and the second domain barrier 2632 represent domain walls, which are interfaces that separate magnetic domains, such as the magnetic domains 2612, 2614, and 2616, respectively. The first and second domain barriers 2630 and 2632 represent transitions between different magnetic moments. In a particular embodiment, the first and second domain barriers 2630 and 2632 may represent a change in a magnetic moment where a magnetic field undergoes an angular displacement of 0 or 180 degrees.

The direction of a magnetic field associated with the first magnetic domain 2612 (i.e., a direction of a magnetic field within the free layer 2600 at the first sidewall 2602) may be altered using a first write current 2622. Similarly, a direction of a magnetic field associated with the second magnetic domain 2614 carried by the free layer 2600 of the second sidewall 2604 may be altered using a second write current 2624. A direction of a magnetic field associated with the third magnetic domain 2616 that is carried by the free layer 2600 at the third sidewall 2606 may be altered using a third write current 2626. A direction of a magnetic field associated with the fourth magnetic domain 2618 carried by the free layer 2600 at the bottom wall 2608 may be altered using a fourth write current 2628.

Figure 27:
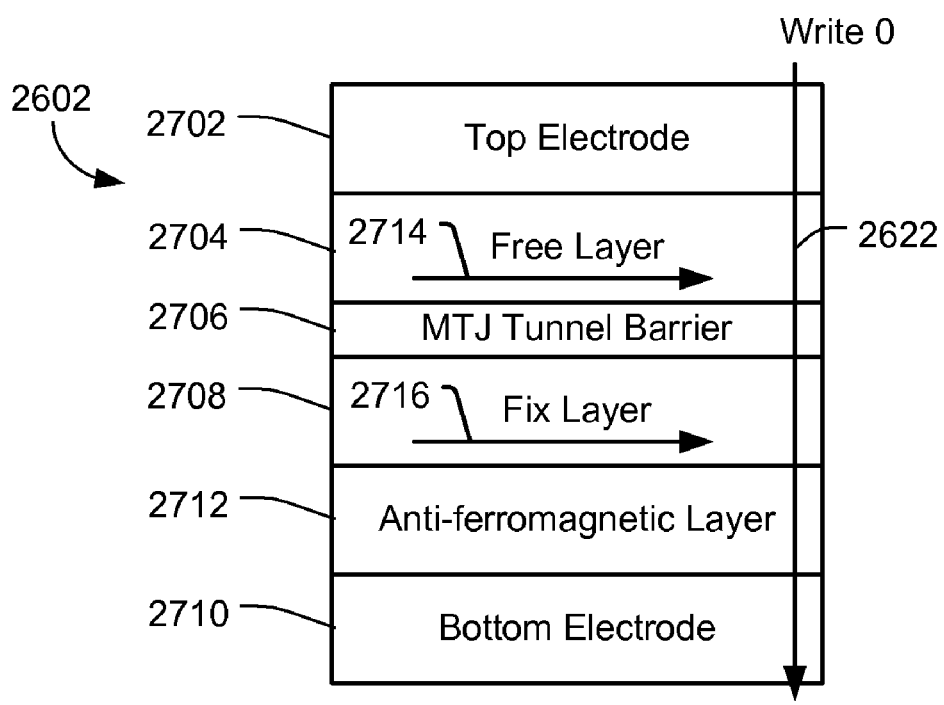
FIG. 27 is a cross-sectional view of an MTJ cell including the free layer of FIG. 26 illustrating a write current to configure the magnetic domains of the free layer to represent a zero value.

In general, a relative direction of the magnetic field carried by the free layer 2600 relative to a fixed magnetic field in the fixed layer (such as the free layer 2704 relative to fixed layer 2708 illustrated in FIG. 27) of each of the sidewalls 2602, 2604 and 2606 and of the bottom wall 2608 determines the bit value. In the example shown, magnetic orientations of the fixed layer and of the free layer 2600 are in parallel (as illustrated by magnetic fields 2714 and 2716 in FIG. 27). Accordingly, each of the write currents 2622, 2624, 2626 and 2628 may represent write "0" currents, altering a direction of the magnetic field associated with the respective magnetic domains 2612, 2614, 2616 and 2618 within the free layer 2600 to represent a reset or "0" state.

FIG. 27 is a cross-sectional view of an MTJ cell 2700 including the free layer 2600 of the sidewall 2602 of FIG. 26 illustrating a write current to configure the magnetic domains of the free layer to represent a zero value. The MTJ cell 2700 includes a top electrode 2702, a free layer 2704 (i.e., the free layer 2612 in FIG. 26), a magnetic tunnel junction tunnel barrier 2706, a fixed layer 2708, an anti-ferromagnetic (AF) layer 2712, and a bottom electrode 2710. In general, the top electrode 2702 and the bottom electrode 2710 are electrically conductive layers adapted to carry an electrical current. The fixed layer 2708 is a ferromagnetic layer that has been annealed to fix a direction of a magnetic field 2716 within the fixed (pinned) layer 2708. The free layer 2704 is a ferromagnetic layer having a magnetic field that can be changed by a write current. The MTJ tunnel barrier or barrier layer 2706 may be formed from an oxide of metal material. The direction of a magnetic field 2714 within the free layer 2704 may be changed using the write current 2622. The direction of the magnetic field 2716 within the fixed layer 2708 is pinned by the anti-ferromagnetic (AF) layer 2712.

A direction of the magnetic fields in the free layer 2704 relative to the fixed magnetic field of the fixed layer 2708 indicates whether the data bit stored at the free layer 2704 of the particular MTJ cell 2700 is a bit value of "1" or bit value of "0." The magnetic direction of the magnetic field in the free layer 2704, generally indicated at 2714, may be changed using the write current 2622. As shown, the write current 2622 represent a write 0 current that flows from the top electrode 2702 through the free layer 2704 across the magnetic tunnel junction barrier 2706 through the fixed layer 2708 and through the anti-ferromagnetic (AF) layer 2712 and through the bottom electrode 2710. The MTJ cell 2700 may also include additional layers (not shown) for seed layer, connection, or performance enhancement purposes. In an illustrative embodiment, any or all of the embodiments illustrated in FIGS. 1-34 may include a MTJ stack structure substantially similar to the MTJ stack structure of the MTJ cell 2700.

Figure 28:
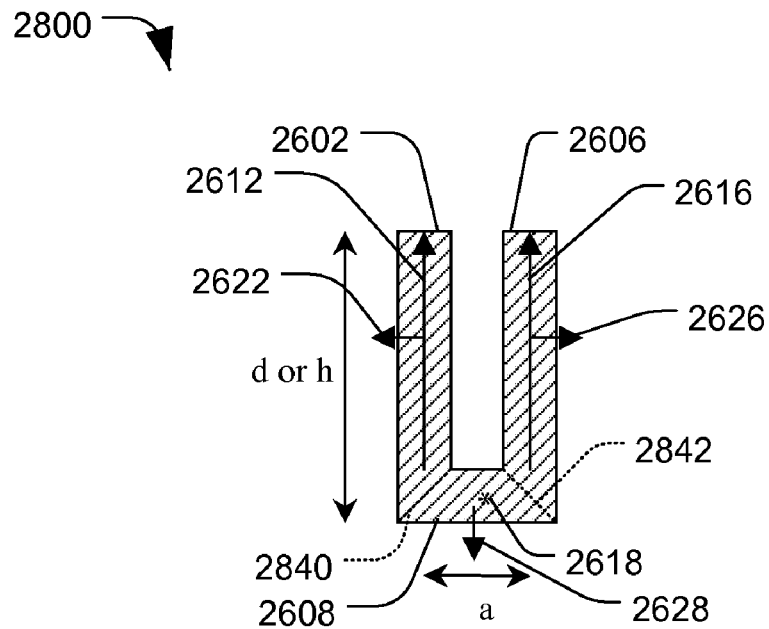
FIG. 28 is cross-sectional view of the free layer of FIG. 26 taken along line 28-28 in FIG. 26.

FIG. 28 is cross-sectional view of the free layer of FIG. 26 taken along line 28-28 in FIG. 26. FIG. 28 is a cross-sectional view 2800 of the free layer 2600 taken along line 28-28 in FIG. 26. The free layer 2600 includes the first sidewall 2602, the third sidewall 2606 and the bottom wall 2608. In this example, a direction of a first magnetic domain carried by the free layer 2600 at the first sidewall 2602, as indicated at 2612, extends in a direction of a depth (d) of the first sidewall 2602, which corresponds to the arrow 2612. A direction of a third magnetic domain carried by the free layer of the third sidewall 2606, as indicated at 2616, extends in a direction of the depth (d) of the third sidewall 2606, which corresponds to the arrow 2616. In this example, the first and third magnetic domains 2612 and 2616 may extend in a direction that is substantially perpendicular to a surface of a substrate. The fourth magnetic domain 2618 associated with the bottom wall 2608 extends in a direction that is substantially perpendicular to the first and third magnetic domains 2612 and 2616 and substantially parallel to the surface of the substrate. Additionally the fourth magnetic domain 2618 extends in a direction into the page, as indicated by the tail of an arrow (asterisk).

The free layer 2600 includes a first domain barrier (wall) 2840 and a second domain barrier 2842. In a particular example, the first domain barrier 2840 may correspond to a structural interface between the first sidewall 2602 and the bottom wall 2608. The first domain barrier 2840 isolates a first magnetic domain 2612 of the free layer 2600 at the first sidewall 2602 from a fourth magnetic domain 2618 of the bottom wall 2608. The second domain barrier 2842 may correspond to a structural interface between the bottom wall 2608 and the third sidewall 2606. The second domain barrier 2842 isolates a magnetic domain 2616 of a free layer of the third sidewall 2606 from the magnetic domain 2618 of the free layer 2600 associated with the bottom wall 2608.

In the embodiment illustrated in FIG. 28, the free layer 2600 may be adapted to store at least three data bits. A first data bit may be represented by a direction of the first magnetic domain 2612 carried by the free layer 2600 at the first sidewall 2602. A second data bit may be represented by the fourth magnetic domain 2618 carried by the free layer 2600 at the bottom wall 2608. A third data bit may be represented by the third magnetic domain 2616 carried by the free layer 2600 at the third sidewall 2606. The write currents 2622, 2626, and 2628 may be applied to selectively alter an orientation of a corresponding magnetic domain 2612, 2616, and/or 2618 of a selected sidewall without altering the orientation of the magnetic domain associated with the other sidewall or of the bottom wall 2608, for example.

Figure 29:
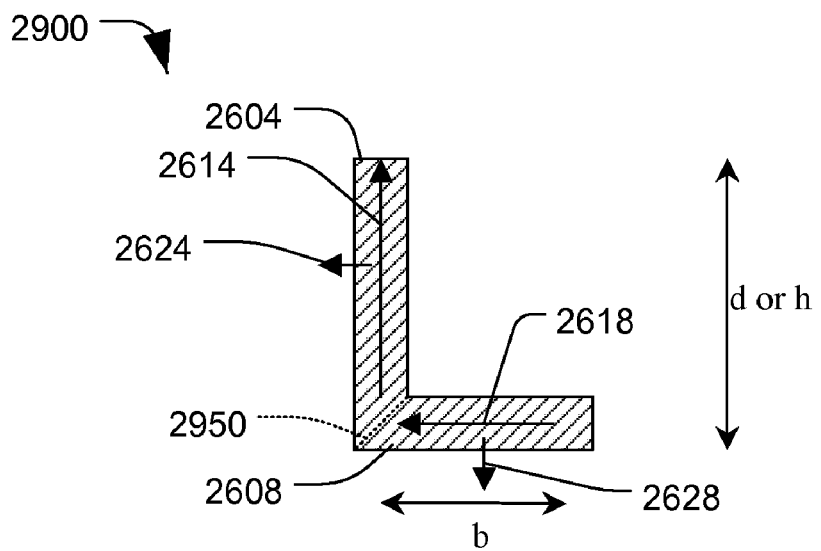
FIG. 29 is a cross-sectional view of the free layer of FIG. 26 taken along line 29-29 in FIG. 26.

FIG. 29 is a diagram of a cross-sectional view 2900 of the free layer 2600 illustrated in FIG. 26, taken along lines 29-29. The free layer 2600 includes the sidewall 2604 and the bottom wall 2608. In this particular example, the free layer 2600 includes a magnetic domain barrier 2950. The magnetic domain barrier (or wall) 2950 isolates the magnetic domain 2618 carried by the free layer 2600 at the bottom wall 2608 from the magnetic domain 2614 carried by the free layer 2600 at the second sidewall 2604. The domain barrier 2950 may correspond to a structural interface between the sidewall 2604 and the bottom wall 2608. The second magnetic domain 2614 extends in a direction that corresponds to a depth (d) of the sidewall 2604 (i.e., in a direction that is substantially normal to a surface of a substrate). The fourth magnetic domain 2618 extends in a direction that is substantially perpendicular to the second magnetic domain 2614 and to the depth (d) and in a direction that is parallel to a width (b) of an MTJ cell. The depth (d) (as illustrated in FIGS. 2-13) or height (h) (as illustrated in FIGS. 14-25) may represent a trench depth or may represent a height of the sidewall.

In a particular illustrative embodiment, the domain barriers 2630 and 2632 illustrated in FIG. 26, the domain barriers 2840 and 2842 illustrated in FIG. 28, and the domain barrier 2950 illustrated in FIG. 29 allow the free layer 2600 to store multiple data bits. In particular, the free layer 2600 illustrated in FIG. 26 may be adapted to store up to four data bits, which may be represented by the magnetic domains 2612, 2614, 2616, and 2618, illustrated in FIGS. 26, 28, and 29.

Figure 30:
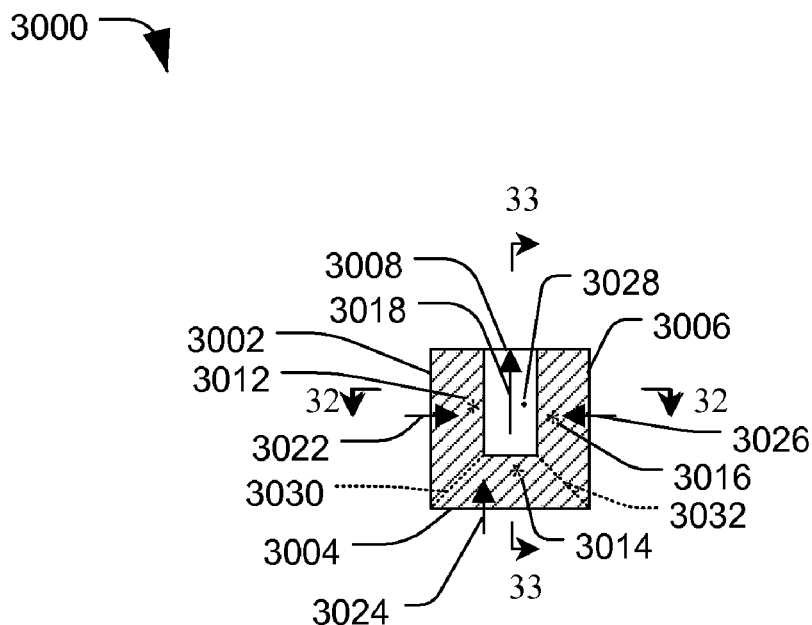
FIG. 30 is a top view of a free layer of an MTJ cell having multiple lateral magnetic domains configured in a one-value state.

FIG. 30 is a top view of a free layer 3000 of an MTJ cell having multiple lateral magnetic domains configured in a one-value state. In this example, the free layer 3000 is illustrated in a bit-one state, where each of the bits represents a one value (i.e., a logical "1" value). The free layer 3000 includes a first sidewall 3002, a second sidewall 3004, a third sidewall 3006, and a bottom wall 3008. The free layer 3000 of each of the sidewalls 3002, 3004, and 3006 and of the bottom wall 3008 carry unique magnetic domains configured to represent a data value, such as a "1" or a "0" value. The first sidewall 3002 carries a first magnetic domain 3012. The second sidewall 3004 carries a second magnetic domain 3014. The third sidewall 3006 carries a third magnetic domain 3016. The bottom wall 3008 carries a fourth magnetic domain 3018. The magnetic domains 3012, 3014, and 3016 extend into the page as indicated by asterisks (i.e., tail of an arrow). In this particular instance, a depth of each of the sidewalls 3002, 3004, and 3006 is greater than a respective length or width of each of the sidewalls 3002, 3004, and 3006. Accordingly, the magnetic domains 3012, 3014, and 3016 are oriented lengthwise in a direction of the depth.

The first magnetic domain 3012 of the first sidewall 3002 is separated from the second magnetic domain 3014 of the second sidewall 3004 by a first domain barrier 3030. Similarly, the second magnetic domain 3014 of the second sidewall 3004 is separated from the third magnetic domain 3016 of the third sidewall 3006 by a second domain barrier 3032.

In general, the first domain barrier 3030 and the second domain barrier 3032 represent domain walls, which are interfaces that separate magnetic domains, such as the magnetic domains 3012, 3014, and 3016, respectively. The first and second domain barriers 3030 and 3032 represent transitions between different magnetic moments. In a particular embodiment, the first and second domain barriers 3030 and 3032 may represent a change in a magnetic moment where a magnetic field undergoes an angular displacement of 0 or 180 degrees.

The direction of a magnetic field associated with the first magnetic domain 3012 (i.e., a direction of a magnetic field within the free layer 3000 at the first sidewall 3002) may be altered using a first write current 3022. Similarly, a direction of a magnetic field associated with the second magnetic domain 3014 carried by the free layer 3000 of the second sidewall 3004 may be altered using a second write current 3024. A direction of a magnetic field associated with the third magnetic domain 3016 that is carried by the free layer 3000 at the third sidewall 3006 may be altered using a third write current 3026. A direction of a magnetic field associated with the fourth magnetic domain 3018 carried by the free layer 3000 at the bottom wall 3008 may be altered using a fourth write current 3028.

Figure 31:
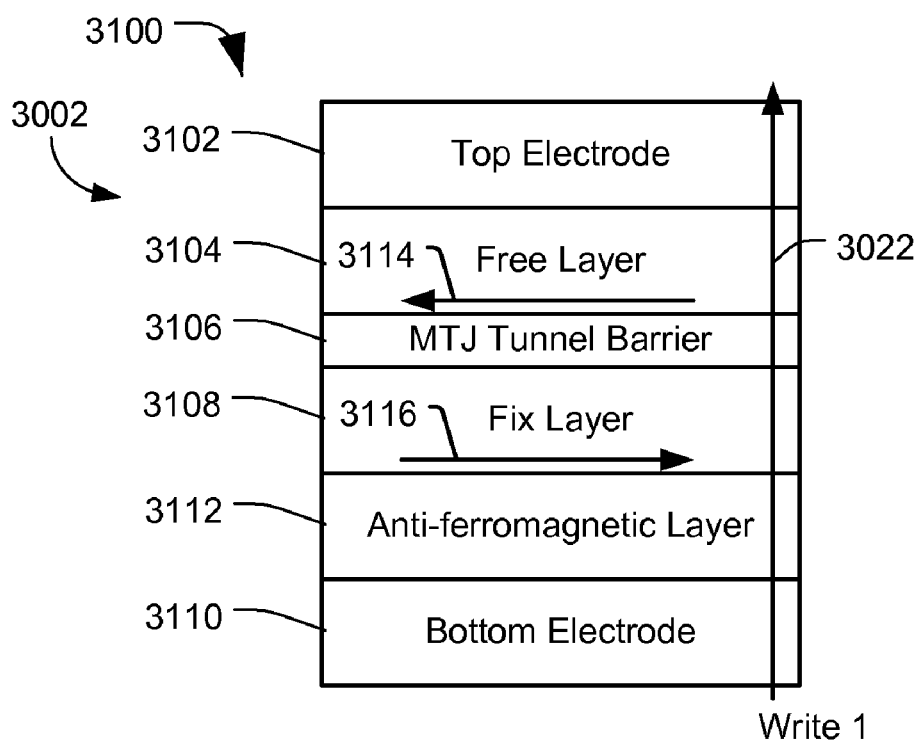
FIG. 31 is a cross-sectional view of an MTJ cell including the free layer of FIG. 30 illustrating a write current to configure the magnetic domains of the free layer to represent a one value.

In general, a relative direction of the magnetic field carried by the free layer 3000 relative to a fixed magnetic field in the fixed layer (such as the free layer 3104 relative to fixed layer 3108 illustrated in FIG. 31) of each of the sidewalls 3002, 3004 and 3006 and of the bottom wall 3008 determines the bit value. In the example shown, magnetic orientations of the fixed layer and of the free layer 3000 are anti-parallel (as illustrated by magnetic fields 3114 and 3116 in FIG. 31). Accordingly, each of the write currents 3022, 3024, 3026 and 3028 may represent write "1" currents, altering a direction of the magnetic field associated with the respective magnetic domains 3012, 3014, 3016 and 3018 within the free layer 3000 to represent a reset or "1" state.

FIG. 31 is a cross-sectional view of an MTJ cell 3100 including the free layer 3000 of the sidewall 3002 of FIG. 30 illustrating a write current to configure the magnetic domains of the free layer to represent a one value. The MTJ cell 3100 includes a top electrode 3102, a free layer 3104 (i.e., the free layer 3012 in FIG. 30), a magnetic tunnel junction tunnel barrier 3106, a fixed layer 3108, an anti-ferromagnetic (AF) layer 3112, and a bottom electrode 3110. In general, the top electrode 3102 and the bottom electrode 3110 are electrically conductive layers adapted to carry an electrical current. The fixed layer 3108 is a ferromagnetic layer that has been annealed to fix a direction of a magnetic field 3116 within the fixed (pinned) layer 3108. The free layer 3104 is a ferromagnetic layer that can be programmed. The MTJ tunnel barrier or barrier layer 3106 may be formed from an oxide of metal material. The direction of a magnetic field 3114 within the free layer 3104 may be changed using the write current 3022. The magnetic field 3116 of the fixed layer 3108 is pinned by the anti-ferromagnetic (AF) layer 3112.

A direction of the magnetic fields in the free layer 3104 relative to the fixed magnetic field of the fixed layer 3108 indicates whether the data bit stored at the free layer 3104 of the particular MTJ cell 3100 is a bit value of "1" or bit value of "0." The magnetic direction of the magnetic field in the free layer 3104, generally indicated at 3114, may be changed using the write current 3022. As shown, the write current 3022 represents a write "1" current that flows from the bottom electrode 3110 through the AF layer 3112 through the fixed layer 3108 across the magnetic tunnel junction barrier 3106 through the free layer 3104 and through the top electrode 3102. The MTJ cell 3100 may include additional layers (not shown) for seed layer, connection, or performance enhancement purposes. In an illustrative embodiment, any MTJ stack depicted in FIGS. 1-34 may include a structure substantially similar to the MTJ cell 3100.

Figure 32:
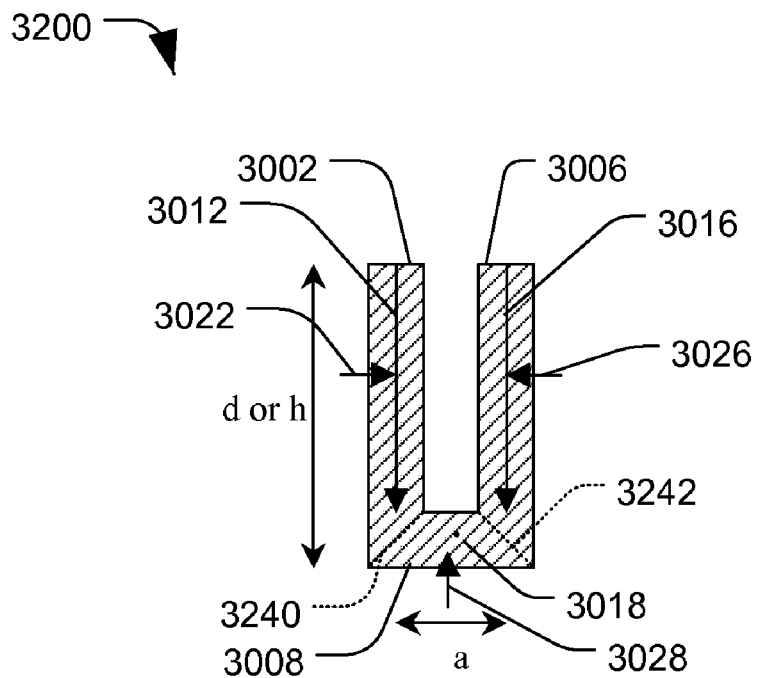
FIG. 32 is cross-sectional view of the free layer of FIG. 30 taken along line 32-32 in FIG. 30.

FIG. 32 is a cross-sectional view 3200 of the free layer 3000 taken along line 32-32 in FIG. 30. The free layer 3000 includes the first sidewall 3002, the third sidewall 3006 and the bottom wall 3008. In this example, a direction of a first magnetic domain carried by the free layer 3000 at the first sidewall 3002, as indicated at 3012, extends in a direction of a depth (d) of the first sidewall 3002, which corresponds to the arrow 3012. A direction of a third magnetic domain carried by the free layer of the third sidewall 3006, as indicated at 3016, extends in a direction of the depth (d) of the third sidewall 3006, which corresponds to the arrow 3016. In this example, the first and third magnetic domains 3012 and 3016 may extend in a direction that is substantially perpendicular to a surface of a substrate. The fourth magnetic domain 3018 associated with the bottom wall 3008 extends in a direction that is substantially perpendicular to the first and third magnetic domains 3012 and 3016 and substantially parallel to the surface of the substrate. Additionally the fourth magnetic domain 3018 extends in a direction out from the page view, as indicated by the arrow head (dot).

The free layer 3000 includes a first domain barrier (wall) 3240 and a second domain barrier 3242. In a particular example, the first domain barrier 3240 may correspond to a structural interface between the first sidewall 3002 and the bottom wall 3008. The first domain barrier 3240 isolates a first magnetic domain 3012 of the free layer 3000 at the first sidewall 3002 from a fourth magnetic domain 3018 of the bottom wall 3008. The second domain barrier 3242 may correspond to a structural interface between the bottom wall 3008 and the third sidewall 3006. The second domain barrier 3242 isolates a magnetic domain 3016 of a free layer of the third sidewall 3006 from the magnetic domain 3018 of the free layer 3000 associated with the bottom wall 3008.

In the embodiment illustrated in FIG. 32, the free layer 3000 may be adapted to store at least three data bits. A first data bit may be represented by a direction of the first magnetic domain 3012 carried by the free layer 3000 at the first sidewall 3002. A second data bit may be represented by the fourth magnetic domain 3018 carried by the free layer 3000 at the bottom wall 3008. A third data bit may be represented by the third magnetic domain 3016 carried by the free layer 3000 at the third sidewall 3006. The write currents 3022, 3026, and 3028 may be applied to selectively alter an orientation of a corresponding magnetic domain 3012, 3016, and/or 3018 of a selected sidewall without altering the orientation of the magnetic domain associated with the other sidewall or of the bottom wall 3008, for example.

Figure 33:
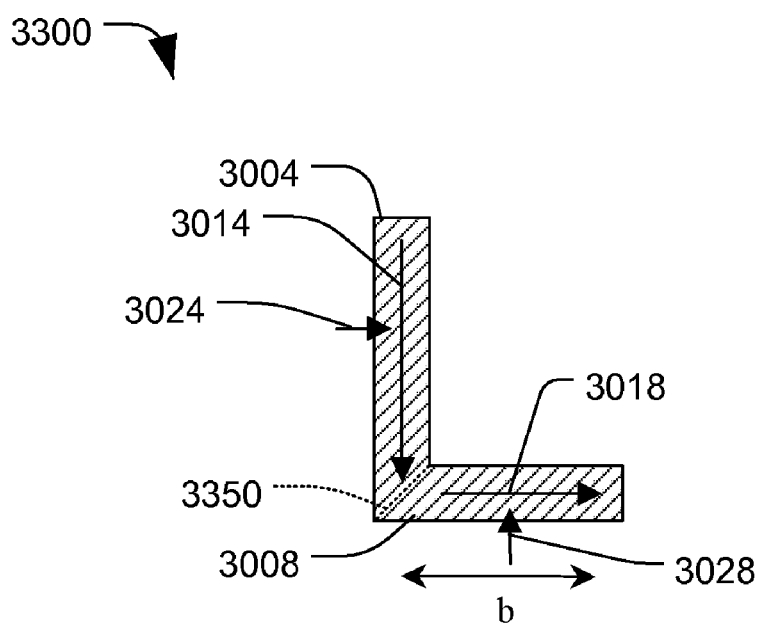
FIG. 33 is a cross-sectional view of the free layer of FIG. 30 taken along line 33-33 in FIG. 30.

FIG. 33 is a diagram of a cross-sectional view 3300 of the free layer 3000 illustrated in FIG. 30, taken along lines 33-33. The free layer 3000 includes the sidewall 3004 and the bottom wall 3008. In this particular example, the free layer 3000 includes magnetic domains barrier 3350. The magnetic domain barrier (or wall) 3350 isolates the magnetic domain 3018 carried by the free layer 3000 at the bottom wall 3008 from the magnetic domain 3014 carried by the free layer 3000 at the second sidewall 3004. The domain barrier 3350 may correspond to a structural interface between the sidewall 3004 and the bottom wall 3008. The second magnetic domain 3014 extends in a direction that corresponds to a depth (d) of the sidewall 3004 (i.e., in a direction that is substantially normal to a surface of a substrate). The fourth magnetic domain 3018 extends in a direction that is substantially perpendicular to the second magnetic domain 3014 and to the depth (d) and in a direction that is parallel to a width (b) of the MTJ cell. The depth (d) or height (h) may represent a trench depth or may represent a height of the sidewall.

In a particular illustrative embodiment, the domain barriers 3030 and 3032 illustrated in FIG. 30, the domain barriers 3240 and 3242 illustrated in FIG. 32, and the domain barrier 3350 illustrated in FIG. 33 allow the free layer 3000 to store multiple data bits. In particular, the free layer 3000 illustrated in FIG. 30 may be adapted to store up to four data bits, which may be represented by the magnetic domains 3012, 3014, 3016, and 3018, illustrated in FIGS. 30, 32, and 33.

Figure 34:
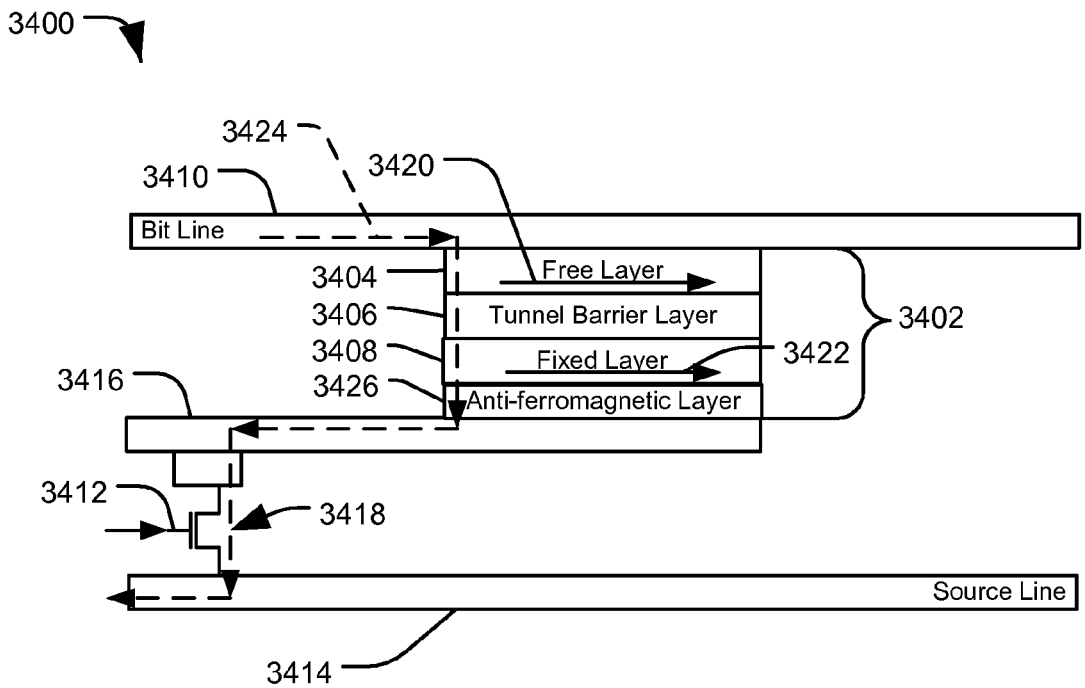
FIG. 34 is a cross-sectional view of a particular embodiment of a MTJ cell.

FIG. 34 is a cross-sectional view of a particular embodiment of a magnetic tunnel junction (MTJ) cell 3400. The MTJ cell 3400 includes an MTJ stack 3402 having a free layer 3404, a tunnel barrier layer 3406, a fixed (pinned) layer 3408, and an anti-ferromagnetic (AF) layer 3426. The MTJ stack 3402 is coupled to a bit line 3410. Further, the MTJ stack 3402 is coupled to a source line 3414 via a bottom electrode 3416 and a switch 3418. A word line 3412 is coupled to a control terminal of the switch 3418 to selectively activate the switch 3418 to allow a write current 3424 to flow from the bit line 3410 to the source line 3414. In the embodiment shown, the fixed layer 3408 includes a magnetic domain 3422 that has a fixed orientation. The free layer 3404 includes a magnetic domain 3420, which is programmable via the write current 3424. As shown, the write current 3410 is adapted to program the orientation of the magnetic domain 3420 at the free layer 3404 to a zero state (i.e., the magnetic domains 3420 and 3422 are oriented in the same direction). To write a one value to the MTJ cell 3400, the write current 3424 is reversed, causing the orientation of the magnetic domain 3420 at the free layer 3404 to flip directions, such that the magnetic domain 3420 extends in a direction opposite to that of the magnetic domain 3422. In an illustrative embodiment, any of the embodiments depicted in FIGS. 2-33 may include an MTJ stack substantially similar to the MTJ stack 3402.

Figure 35:
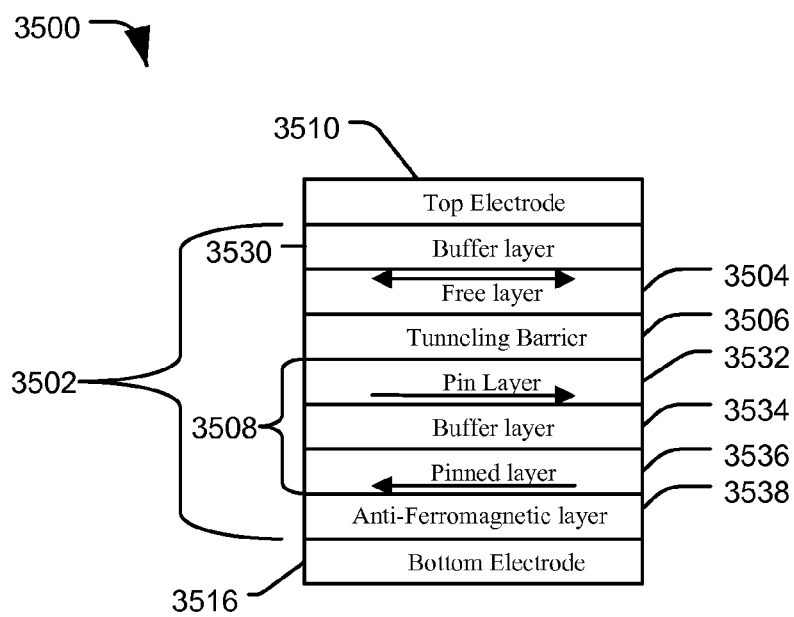
FIG. 35 is a cross-sectional view of another particular embodiment of an MTJ cell that provides an increased resistance.

FIG. 35 is a cross-sectional view of another particular embodiment of an MTJ cell 3500, which provides more fixed layer value and an increased resistance. In particular, the MTJ cell 3500 includes an MTJ stack 3502 including the free layer 3504, the tunnel barrier layer 3506, and the fixed layer 3508. The free layer 3504 of the MTJ stack is coupled to the top electrode 3510 via a buffer layer 3530. In this example, the fixed layer 3508 of the MTJ stack 3502 is coupled to the bottom electrode 3516 via an anti-ferromagnetic layer 3538. Additionally, the fixed layer 3508 includes a first pinned (fixed) layer 3532, a buffer layer 3534, and a second pinned (fixed) layer 3536. The first and second pinned layers 3532 and 3536 have respective magnetic domains which are oriented in opposing directions, thereby increasing fixed layer value and an overall resistance of the MTJ stack 3502. In a particular embodiment, such an increased fixed layer value can enhance a read margin associated with the MTJ stack 3502.

Figure 36:
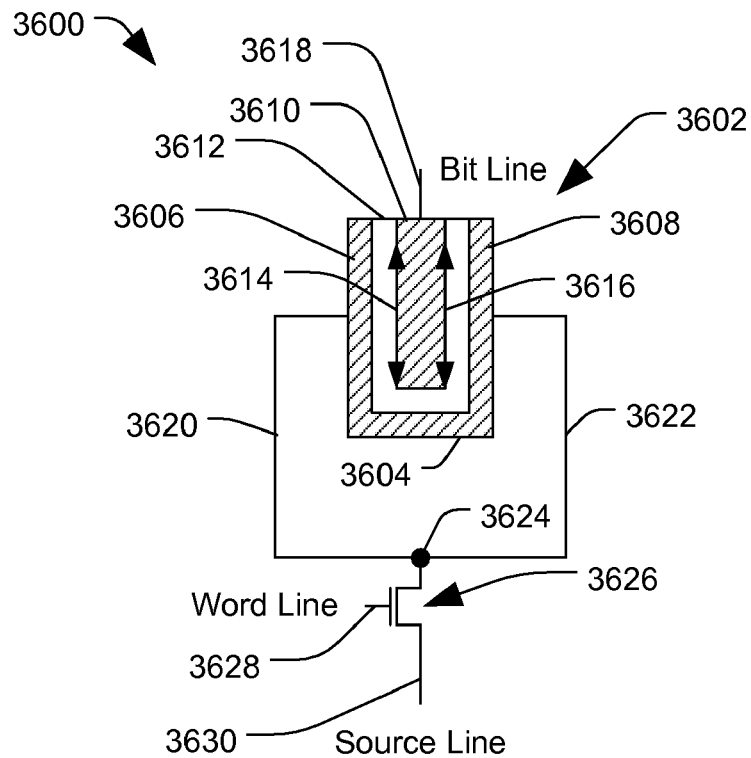
FIG. 36 is a cross-sectional view of an MTJ cell having a single switch device to access a single stored value.

FIG. 36 is a cross-sectional view of an MTJ cell 3600 having a single switch device to access a single stored value. The MTJ cell 3600 includes a bottom electrode including a first sidewall 3606, a bottom wall 3604, and a second sidewall 3608. The MTJ cell 3600 also includes a center electrode 3610 and an MTJ stack 3612. The MTJ stack 3612 separates the center electrode 3610 from the first sidewall 3606, the second sidewall 3608, and the bottom wall 3604 of the bottom electrode. In this embodiment, the MTJ stack 3612 includes a first magnetic domain 3614 and a second magnetic domain 3616. The center electrode 3610 is coupled to a bit line 3618. The first sidewall 3606 and the second sidewall 3608 are coupled to a node 3624 via lines 3620 and 3622. The MTJ cell 3600 also includes a switch 3626 having a first terminal coupled to the node 3624, a second terminal 3630 coupled to a source line, and a control terminal coupled to a word line 3628.

Figure 37:
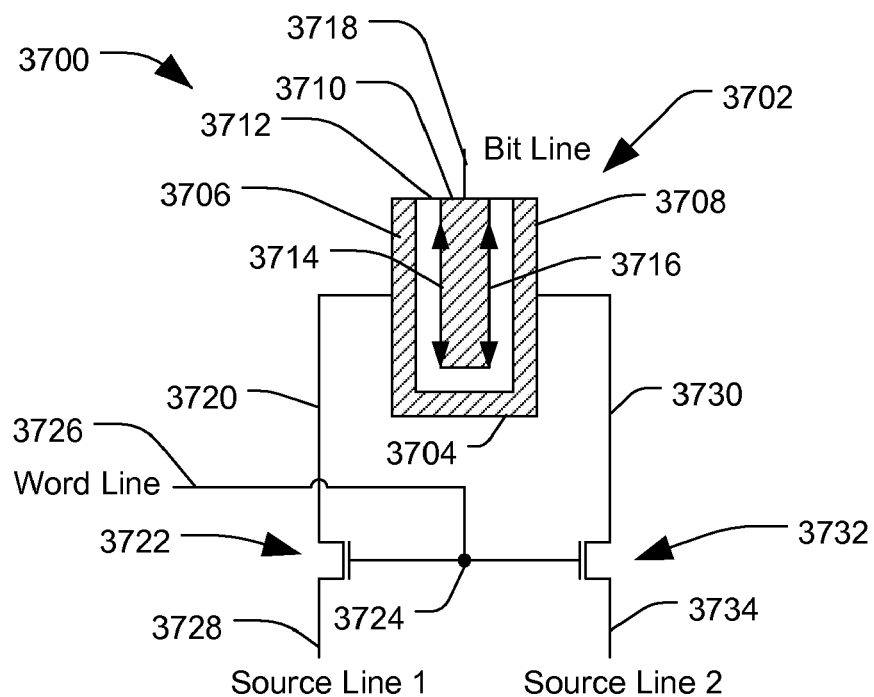
FIG. 37 is a cross-sectional diagram of an MTJ cell having two switch devices to access two stored values.

FIG. 37 is a cross-sectional diagram of an MTJ cell 3700 having two switch devices to access two stored values. The MTJ cell 3700 includes a bottom electrode including a first sidewall 3706, a bottom wall 3704, and a second sidewall 3708. The MTJ cell 3700 also includes a center electrode 3710 and an MTJ stack 3712. The MTJ stack 3712 separates the center electrode 3710 from the first sidewall 3706, the second sidewall 3708, and the bottom wall 3704 of the bottom electrode. In this embodiment, the MTJ stack 3712 includes a first magnetic domain 3714 and a second magnetic domain 3716. The center electrode 3710 is coupled to a bit line 3718. The MTJ cell 3700 includes a first switch 3722 including a first terminal 3720 that is coupled to the first sidewall 3706, a control terminal coupled to a node 3724, and a second terminal coupled to a first source line 3728. The MTJ cell 3700 also includes a word line 3726 that is coupled to the node 3724. The MTJ cell 3700 further includes a second switch 3732 that has a third terminal 3730 coupled to the second sidewall 3708, a control terminal coupled to the node 3724, and a fourth terminal coupled to a second source line 3734. Although depicted as having a shared word line 3726 and separate source lines 3728 and 3734, in other embodiments separate word lines and a shared source line may instead be used.

In a particular embodiment, the first source line 3728 and the second source line 3734 may be selectively activated to read and/or write data from and to the first and second magnetic domains 3714 and 3716. In a particular embodiment, a current or voltage is applied to the bit line 3718 and is applied to the word line 3726 to activate the first and second switches 3722 and 3732. The first source line 3728, separately from and independent of the second source line 3734, may be activated to read data represented by the first magnetic domain 3714. In another particular embodiment, the first source line 3728 and the second source line 3734 may be activated to read data represented by the first and second magnetic domains 3714 and 3716.

Figure 38:
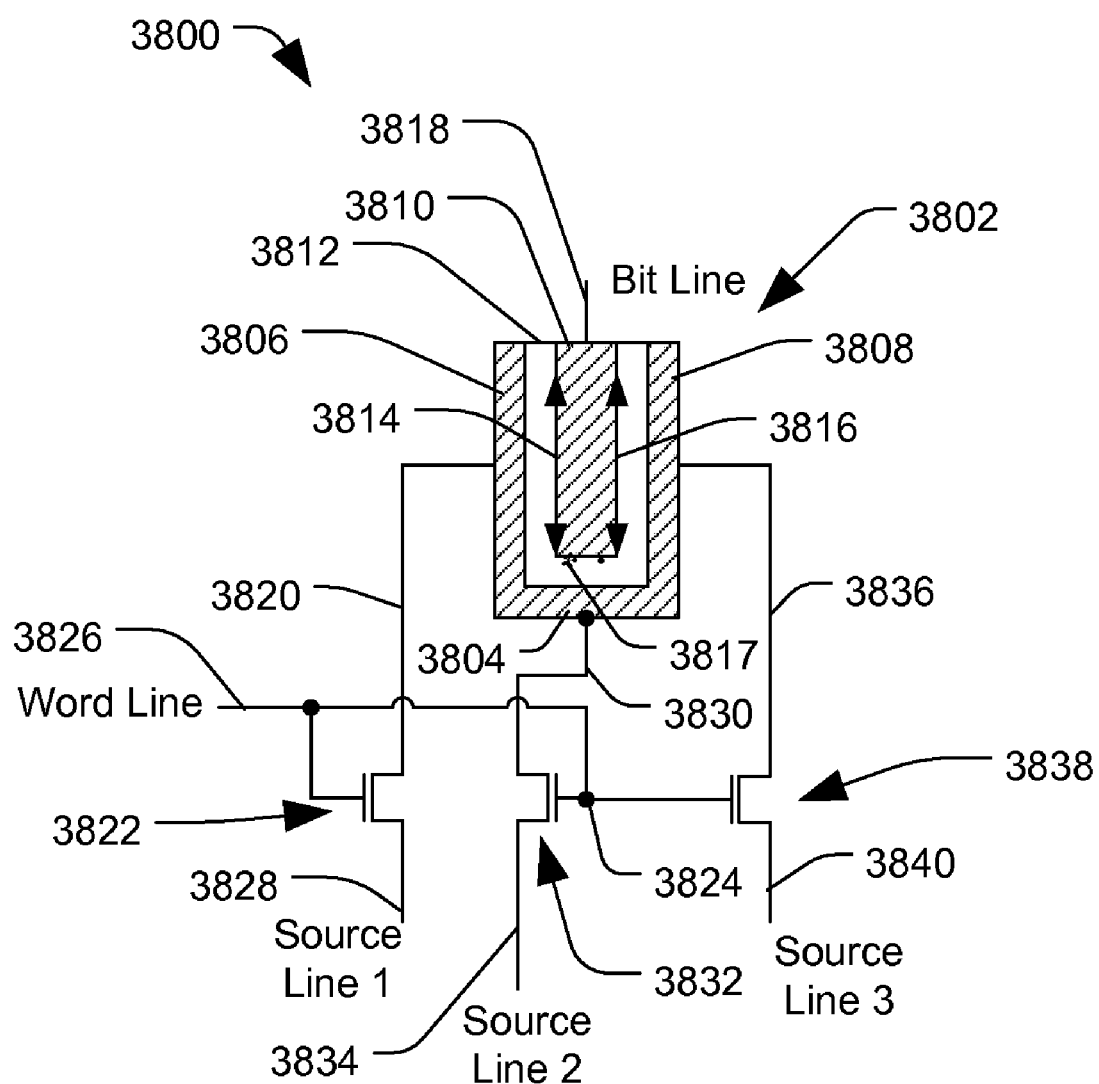
FIG. 38 is a cross-sectional diagram of an MTJ cell having three switch devices to access three stored values.

FIG. 38 is a cross-sectional diagram of an MTJ cell 3800 having three switch devices to access three stored values. The MTJ cell 3800 includes a bottom electrode including a first sidewall 3806, a bottom wall 3804, and a second sidewall 3808. The MTJ cell 3800 also includes a center electrode 3810 and an MTJ stack 3812. The MTJ stack 3812 separates the center electrode 3810 from the first sidewall 3806, the second sidewall 3808, and the bottom wall 3804 of the bottom electrode. In this embodiment, the MTJ stack 3812 includes a first magnetic domain 3814, a second magnetic domain 3816, and a third magnetic domain 3817. The center electrode 3810 is coupled to a bit line 3818. The MTJ cell 3800 includes a first switch 3822 including a first terminal 3820 that is coupled to the first sidewall 3806, a control terminal coupled to a node 3824, and a second terminal coupled to a first source line 3828. The MTJ cell 3800 also includes a word line 3826 that is coupled to the node 3824. The MTJ cell 3800 further includes a second switch 3832 that has a third terminal 3830 coupled to the bottom wall 3804, a control terminal coupled to the node 3824, and a fourth terminal coupled to a second source line 3834. The MTJ cell 3800 also includes a third switch 3838 having a fifth terminal 3836 coupled to the second sidewall 3816, a control terminal coupled to the node 3824, and a sixth terminal coupled to the third source line 3840.

In a particular embodiment, the first source line 3828, the second source line 3834, and the third source line 3840 may be selectively activated to read and/or write data from and to the first, third, and second magnetic domains 3814, 3817, and 3816. In a particular embodiment, a current or voltage is applied to the bit line 3818 and is applied to the word line 3826 to activate the first, second, and third switches 3822, 3832 and 3838. The first source line 3828, the second source line 3832, or the third source line 3840 may be separate and independent of each other and may be activated to read data represented by the first, second, or third magnetic domain 3814, 3816, or 3817. In another particular embodiment, the first source line 3828, the second source line 3832, and the third source line 3840 may be activated to read data represented by the first, third, and second magnetic domains 3814, 3817, and 3816. In an alternative embodiment, a third lateral electrode (not shown) is proximate to a third sidewall that includes a fourth magnetic domain (not shown), and the terminal 3830 is coupled to the third lateral electrode and not to the bottom wall, to enable operation of the MTJ cell 3800 using three lateral electrode connections.

Figure 39:
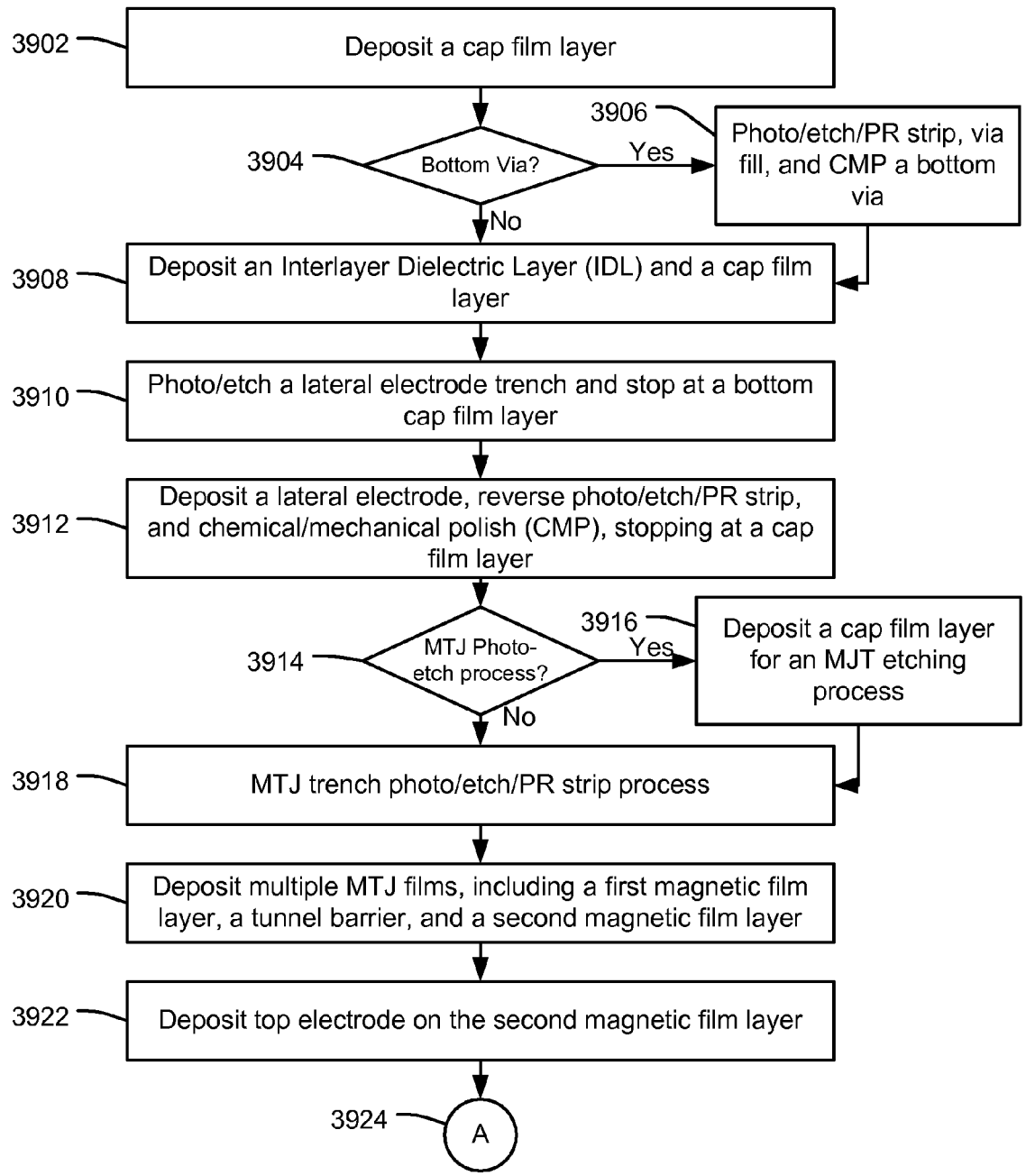
FIGS. 39-40 are flow diagrams of a particular illustrative embodiment of a method of forming a magnetic tunnel junction (MTJ) structure having multiple lateral magnetic domains.
Figure 40:
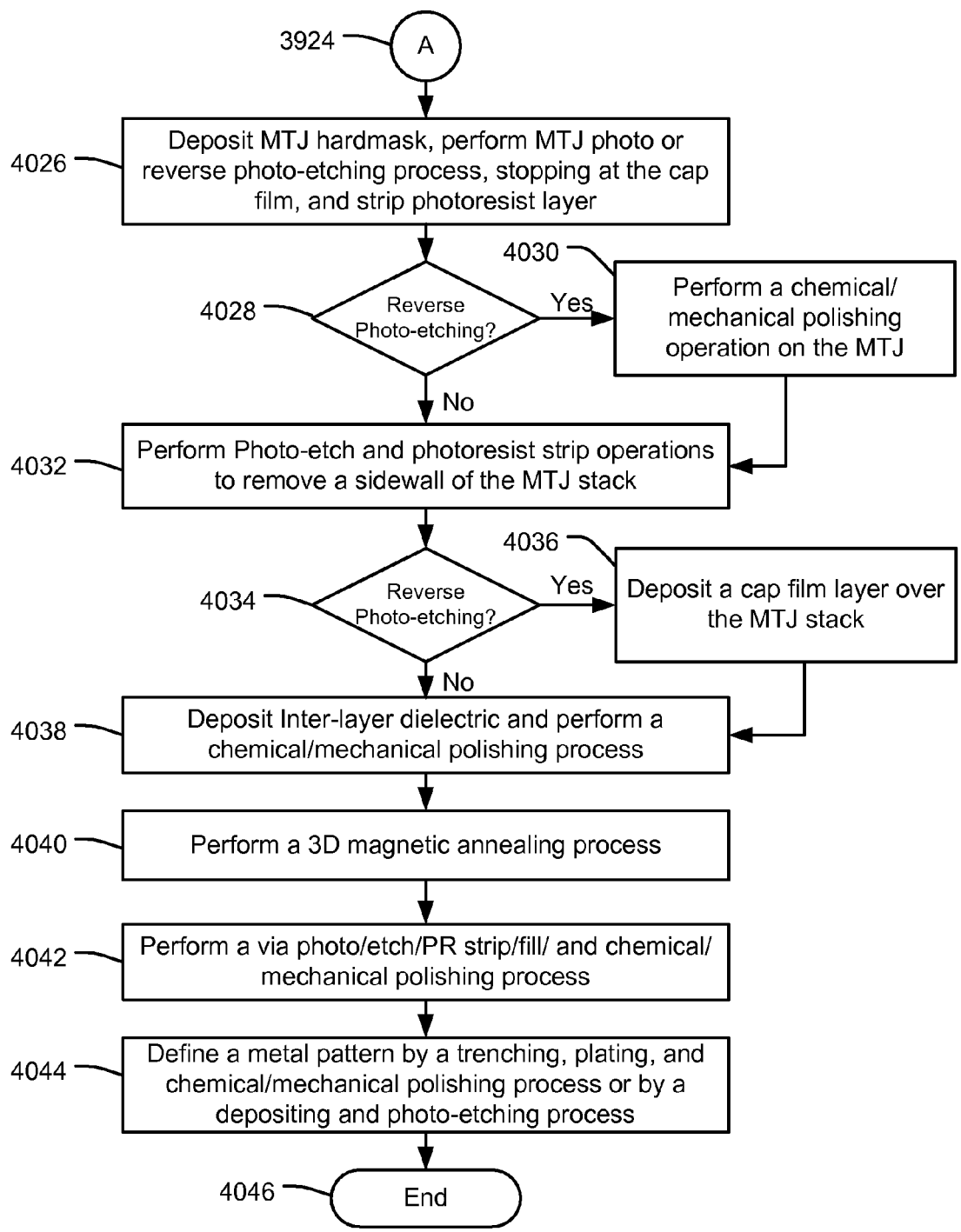

FIGS. 39-40 are flow diagrams of a particular illustrative embodiment of a method of forming a magnetic tunnel junction (MTJ) structure having multiple lateral magnetic domains. At 3902, a cap film layer is deposited. Continuing to 3904, if there is a bottom via, the method advances to 3906 and a photo-etch and photo resist strip, via fill, and Chemical-Mechanical Polishing process are applied to define a bottom via. The method proceeds to 3908 and an inter-layer dielectric layer (IDL) and a cap film layer are deposited.

Returning to 3904, if there is no bottom via, the method proceeds to 3908 and an inter-layer dielectric layer (IDL) and a cap film layer are deposited. Moving to 3910, a lateral electrode trench is formed using a photo-etch process, stopping at a bottom cap film layer. Continuing to 3912, a lateral electrode is deposited and a reverse photo-etch-photo resist strip and chemical-mechanical polishing process is performed, stopping at a cap film layer. Proceeding to 3914, if a MTJ photo-etch will be performed, the method advances to 3916 and a cap film layer is deposited for an MTJ etching process. Continuing to 3918, a photo-etch and photo resist strip process is performed to define an MTJ trench.

Returning to 3914, if a MTJ photo-etch process will not be performed, the method proceeds to 3918 and a photo-etch and photo resist strip process is performed to define an MTJ trench. Continuing to 3920, multiple MTJ films are deposited including a first magnetic film layer, a tunnel barrier, and a second magnetic film layer. Moving to 3922, a top electrode is deposited on the second magnetic film layer. The method advances to 3924 and is continued in FIG. 40.

In FIG. 40, at 3924, the method continues to 4026 and a MTJ hardmask is deposited, an MTJ photo-etching or reverse trench photo-etching process is performed, stopping at the cap film, and the photo-resist layer is stripped. Moving to 4028, if a reverse photo-etching process was performed, the method continues to 4030 and a chemical-mechanical polishing operation is performed on the MTJ structure and stopped at the cap layer. Proceeding to 4032, a sidewall photo-etch and photo resist strip operation is performed to remove a sidewall of the MTJ stack.

Returning to 4028, if reverse trench photo-etching is not performed, the method advances to 4032 and a sidewall photo-etch and photo resist strip operation is performed to remove a sidewall of the MTJ stack. Continuing to 4034, if reverse trench photo-etching is performed, the method moves to 4036 and a cap film layer is deposited over the MTJ stack. Proceeding to 4038, an inter-layer dielectric layer is deposited and a chemical-mechanical polishing process is performed. Returning to 4034, if reverse trench photo-etching is not performed, the method continues to 4038 and an inter-layer dielectric layer is deposited and a chemical-mechanical polishing process is performed. At 4040, a three-dimensional magnetic annealing process is performed. In a particular example, where the MTJ structure is formed within a shallow trench, the magnetic anneal may be performed in a horizontal X-Y direction, to establish a horizontal magnetic orientation. In another particular example, where the MTJ structure is formed within a deeper trench, the magnetic anneal may be performed in a horizontal x-direction and a vertical z-direction. Moving to 4042, a via photo-etch, photo resist strip, fill, and chemical-mechanical polishing (CMP) process is performed. Advancing to 4044, a metal pattern is defined by trenching, photo-etching, plating, and chemical-mechanical processing processes or by a depositing and photo-etching process. The method terminates at 4046.

In a particular embodiment, the method illustrated by FIGS. 39 and 40 illustrate a process flow for the MTJ structures of FIGS. 2-13, which may be formed using an MTJ chemical-mechanical polishing process. Alternatively, the method illustrated by FIGS. 39 and 40 illustrate a process flow for the MTJ structures of FIGS. 14-25, which may be formed by an MTJ etching process. In a particular illustrative embodiment, trench depth and lateral electrode shape may be tightly controlled. In a particular example, the tunnel barrier may be formed from Magnesium Oxide (MgO) or Aluminum Oxide ($Al_2O_3$). In a particular example, the top electrode thickness may be controlled to fill a narrow trend gap without a seam. The cap film layer may be formed from Silicon Nitride (SiN), Silicon Carbon (SiC) or other material, and the MTJ Chemical-Mechanical Polishing (CMP) process stops at the cap film layer. In a particular example, a magnetic anneal process is applied in three dimensions to initialize all horizontal and vertical magnetic domains in an anneal field direction.

Figure 41:
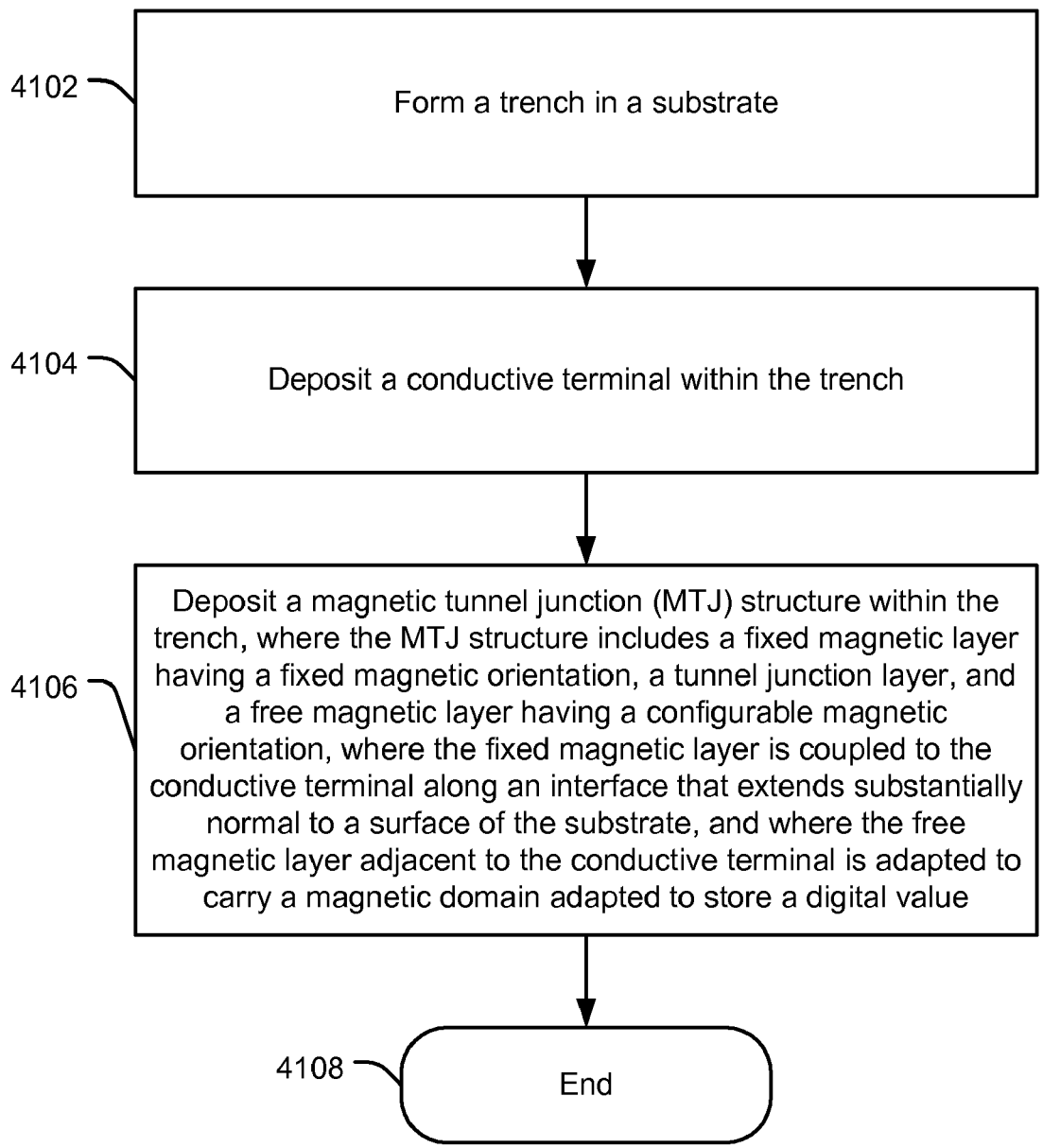
FIG. 41 is a flow diagram of a second particular illustrative embodiment of a method of forming a magnetic tunnel junction (MTJ) structure having multiple lateral magnetic domains.

FIG. 41 is a flow diagram of a second particular illustrative embodiment of a method of forming a magnetic tunnel junction (MTJ) structure having multiple lateral magnetic domains. At 4102, a trench is formed in a substrate. In a particular embodiment, the surface of the substrate is substantially planar. Continuing to 4104, a conductive terminal is deposited within the trench. In a particular embodiment, depositing the conductive terminal includes forming a first conductive terminal within the trench to form a first lateral electrode and forming a second conductive terminal within the trench to form a second lateral electrode. The first conductive terminal is electrically isolated from the second conductive terminal. Proceeding to 4106, a magnetic tunnel junction (MTJ) structure is deposited within the trench. The MTJ structure includes a fixed magnetic layer having a fixed magnetic orientation, a tunnel junction layer, and a free magnetic layer having a configurable magnetic orientation. The fixed magnetic layer is coupled to the conductive terminal along an interface that extends substantially normal to a surface of the substrate. The free magnetic layer is adjacent to the conductive terminal and carries a magnetic domain adapted to store a digital value. The method terminates at 4108. It should be clearly understood that additional fabrication processes may be performed, and that each element of the method may be performed using techniques that are now known or that may be later developed. For example, in an illustrative embodiment, a cap layer may be deposited on the substrate prior to forming the trench, the trench may be formed prior to depositing the conductive terminal, a chemical-mechanical polishing (CMP) process may be performed after depositing the conductive terminal in the trench, the first and second lateral electrode may be formed by depositing a conductive film and then separating the lateral electrodes, a reverse trench photo-etching process and CMP or MTJ photo-etching process may be performed after depositing the MTJ structure within the trench, a three-dimensional magnetic annealing process may be performed, other processing techniques may be performed, or any combination thereof.

In a particular embodiment, the MTJ structure includes an anti-ferromagnetic (AF) layer adjacent to the fixed magnetic layer, and the fixed magnetic layer is coupled to the conductive terminal via the AF layer. The fixed magnetic layer may include a first portion coupled to the first conductive terminal along a first interface that extends substantially normal to a surface of the substrate and includes a second portion coupled to the second conductive terminal along a second interface that extends substantially normal to the surface of the substrate. For example, the first portion may be coupled to the first lateral electrode via the AF layer, and the second portion may be coupled to the second lateral electrode via the AF layer. In another particular embodiment, the fixed magnetic layer further includes a bottom portion that extends substantially parallel to the surface of the substrate.

In a particular embodiment, a photo-etching process may also be performed to remove a portion of the inter-layer dielectric layer according to a pattern to form a cavity, and depositing the conductive terminal includes depositing the conductive terminal within the cavity. For example, a lateral electrode may be formed within such a cavity. In a particular embodiment, the method also includes depositing a second conductive terminal of the MTJ structure. As an illustrative example, the second conductive terminal may include a top electrode. The second conductive terminal may be electrically isolated from the first conductive terminal.

In another particular embodiment, the tunnel junction barrier includes a first junction portion that contacts the first portion of the fixed magnetic layer along a third interface that extends substantially normal to the surface of the substrate. The tunnel junction barrier further includes a second junction portion that contacts the second portion of the fixed magnetic layer along a fourth interface that extends substantially normal to the surface of the substrate. In a particular embodiment, a free magnetic layer is deposited within the trench. The free magnetic layer includes a first free portion that contacts the first junction portion along a fifth interface that extends substantially normal to the surface of the substrate and includes a second free portion that contacts the second junction portion along a sixth interface that extends substantially normal to the surface of the substrate.

Figure 42:
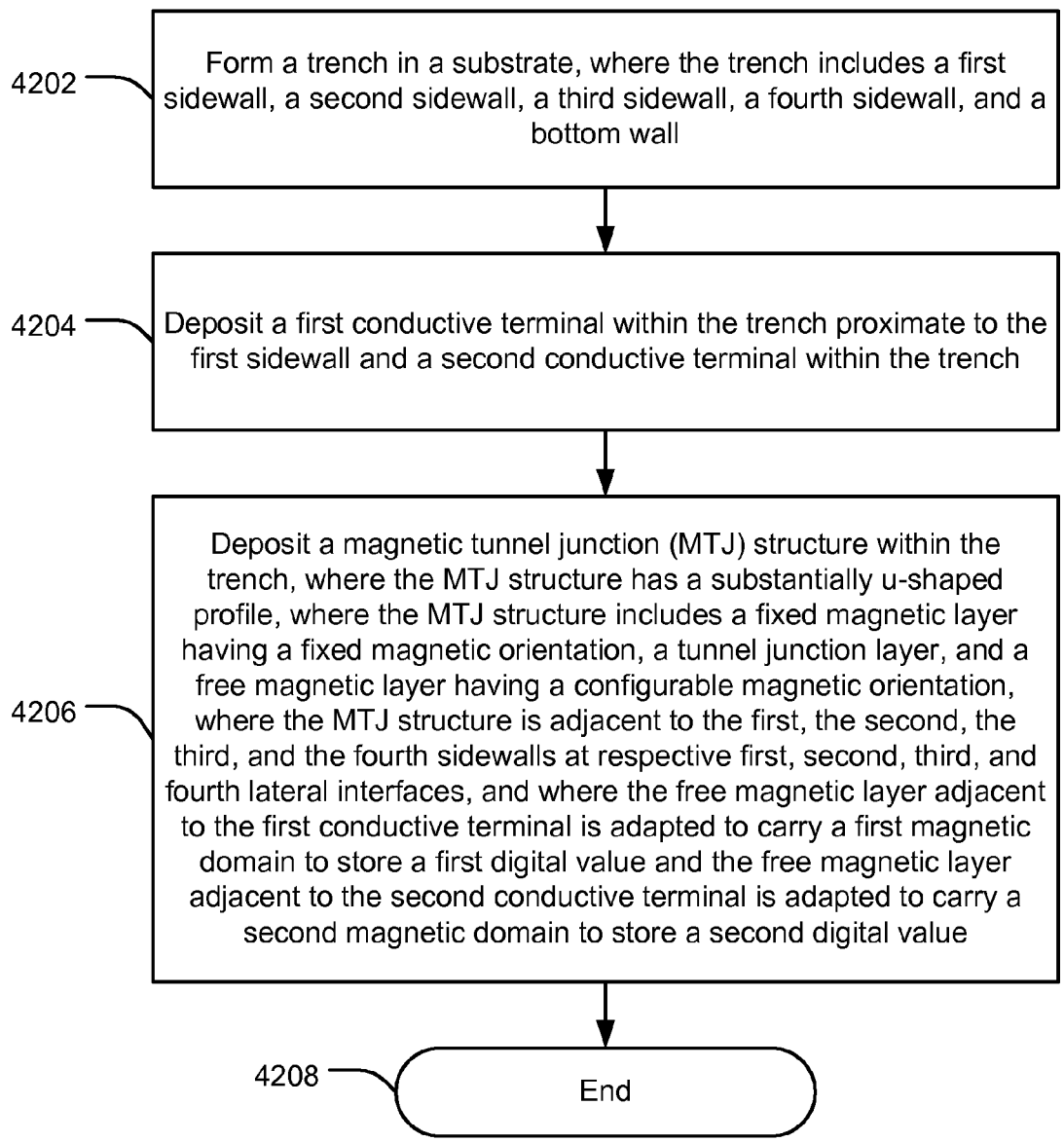
FIG. 42 is a flow diagram of a third particular illustrative embodiment of a method of forming a magnetic tunnel junction (MTJ) structure having multiple lateral magnetic domains.

FIG. 42 is a flow diagram of a third particular illustrative embodiment of a method of forming a magnetic tunnel junction (MTJ) structure having multiple lateral magnetic domains. At 4202, a trench is formed in a substrate. The trench includes a first sidewall, a second sidewall, a third sidewall, a fourth sidewall, and a bottom wall. Continuing to 4204, a first conductive terminal is deposited within the trench proximate to the first sidewall and a second conductive terminal is deposited within the trench. Proceeding to 4206, a magnetic tunnel junction (MTJ) structure is deposited within the trench. The MTJ structure includes a fixed magnetic layer having a magnetic field with a fixed magnetic orientation, a tunnel junction layer, and a free magnetic layer having a magnetic field with a configurable magnetic orientation. The MTJ structure is adjacent to the first, the second, the third, and the fourth sidewalls at respective first, second, third, and fourth lateral interfaces and adjacent to the bottom wall at a bottom interface. The free magnetic layer adjacent to the first conductive terminal is adapted to carry a first magnetic domain to store a first digital value and the free magnetic layer adjacent to the second conductive terminal is adapted to carry a second magnetic domain to store a second digital value.

In a particular embodiment, the first, second, third and fourth lateral interfaces extend approximately perpendicular to a surface of the substrate. In another particular embodiment, a third conductive terminal is formed proximate to the third sidewall of the trench. In a particular embodiment, a portion of the MTJ structure that is adjacent to the fourth sidewall is selectively removed to create an opening such that the MTJ structure is substantially u-shaped. An inter-layer dielectric material may be deposited into the opening. In a particular embodiment, the portion of the MTJ structure may be selectively removed by performing a photo-etching process to define a pattern on the MTJ structure and by removing the portion of the MTJ structure according to the pattern. It should be clearly understood that additional fabrication processes may be performed, and that each element of the method may be performed using techniques that are now known or that may be later developed. For example, in an illustrative embodiment, a cap layer may be deposited on the substrate prior to forming the trench, the trench may be formed prior to depositing the first conductive terminal, a chemical-mechanical polishing (CMP) process may be performed after depositing the first and second conductive terminal in the trench, a reverse trench photo-etching process and CMP or MTJ photo-etching process may be performed after depositing the MTJ structure within the trench, a three-dimensional magnetic annealing process may be performed, other processing techniques may be performed, or any combination thereof.

Figure 43:
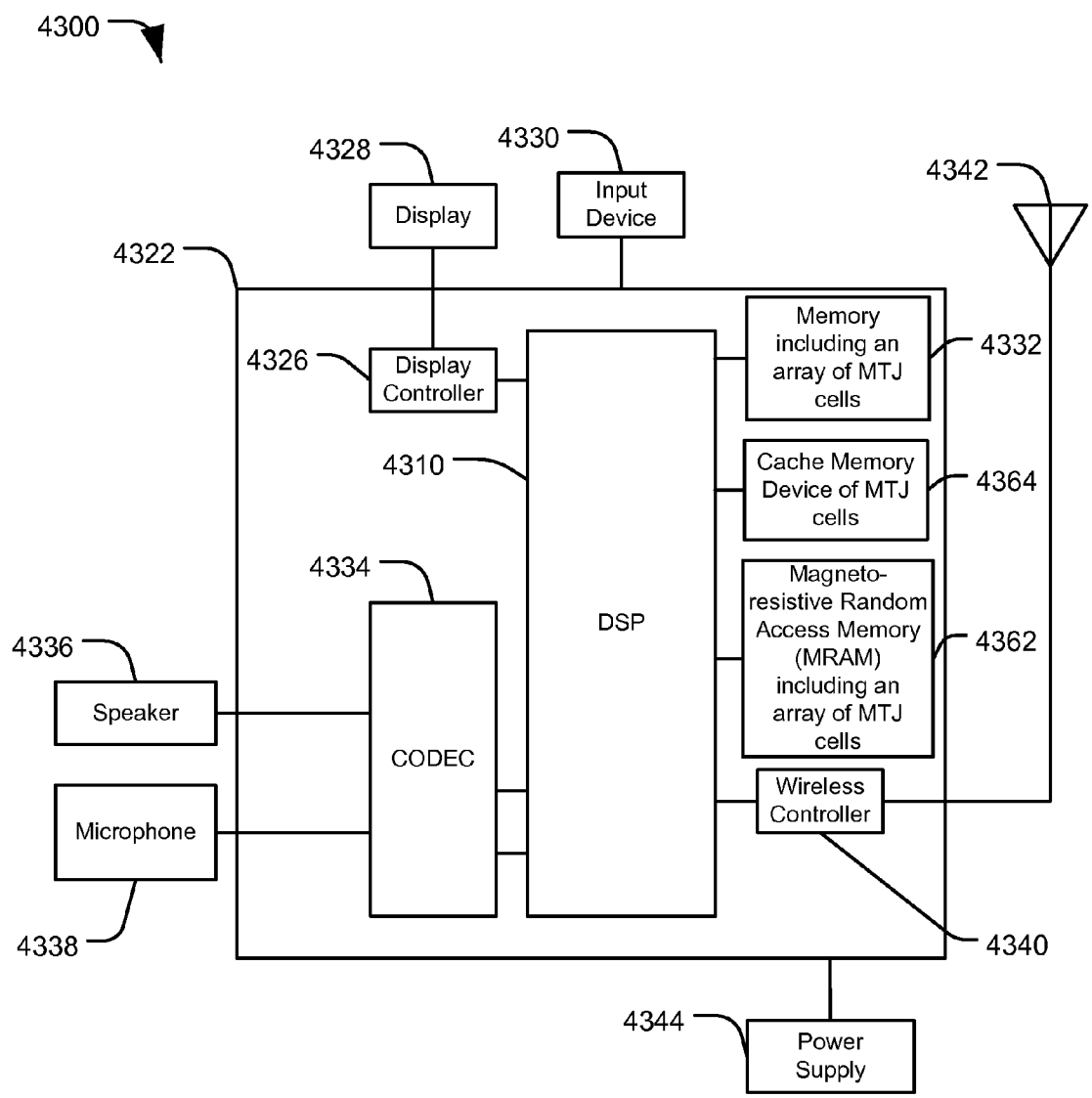
FIG. 43 is a block diagram of a wireless communication device including memory circuits comprises of MTJ cells.

FIG. 43 is a block diagram of a wireless communication device 4300. The wireless communications device 4300 includes a memory having an array of MTJ cells 4332 and a magneto-resistive random access memory (MRAM) including an array of MTJ cells 4362, which are coupled to a processor, such as a digital signal processor (DSP) 4310. The communications device 4300 also includes a cache memory device of MTJ cells 4364 that is coupled to the DSP 4310. The cache memory device of MTJ cells 4364, the memory array of MTJ cells 4332 and the MRAM device including multiple MTJ cells 4362 may include MTJ cells formed according to a process, as described with respect to FIGS. 2-42. In a particular embodiment, the cache memory of MTJ cell 4364, the memory array of MTJ cells 4332, and the MRAM device including multiple MTJ cells 4362 provide a high data storage density relative to conventional memory devices.

FIG. 43 also shows a display controller 4326 that is coupled to the digital signal processor 4310 and to a display 4328. A coder/decoder (CODEC) 4334 can also be coupled to the digital signal processor 4310. A speaker 4336 and a microphone 4338 can be coupled to the CODEC 4334.

FIG. 43 also indicates that a wireless controller 4340 can be coupled to the digital signal processor 4310 and to a wireless antenna 4342. In a particular embodiment, an input device 4330 and a power supply 4344 are coupled to the on-chip system 4322. Moreover, in a particular embodiment, as illustrated in FIG. 43, the display 4328, the input device 4330, the speaker 4336, the microphone 4338, the wireless antenna 4342, and the power supply 4344 are external to the on-chip system 4322. However, each can be coupled to a component of the on-chip system 4322, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method of manufacturing a magnetic tunnel junction device, the method comprising:
   forming a trench in a substrate;
   depositing a conductive terminal within the trench, wherein depositing the conductive terminal comprises forming a first conductive terminal within the trench to form a first lateral electrode and forming a second conductive terminal within the trench to form a second lateral electrode; and
   depositing a magnetic tunnel junction (MTJ) structure within the trench, the MTJ structure including a fixed magnetic layer having a fixed magnetic orientation, a tunnel junction layer, and a free magnetic layer having a configurable magnetic orientation, the fixed magnetic layer coupled to the conductive terminal along an interface that extends substantially normal to a surface of the substrate, the free magnetic layer adjacent to the conductive terminal to carry a magnetic domain adapted to store a digital value.

2. The method of claim 1, wherein the surface of the substrate comprises a substantially planar surface.

3. The method of claim 1, further comprising depositing a cap film layer and an inter-layer dielectric layer and forming the trench before depositing the conductive terminal.

4. The method of claim 3, further comprising performing a photo-etching process to remove a portion of the inter-layer dielectric layer according to a pattern to form a cavity, wherein depositing the conductive terminal comprises depositing the conductive terminal within the cavity.

5. The method of claim 1, wherein the fixed layer is coupled to the conductive terminal via an anti-ferromagnetic layer.

6. The method of claim 1, wherein the first conductive terminal is electrically isolated from the second conductive terminal.

7. The method of claim 1, wherein depositing the MTJ structure comprises depositing the fixed magnetic layer within the trench, the fixed magnetic layer including a first portion coupled to the first conductive terminal via the anti-ferromagnetic layer along a first interface that extends substantially normal to a surface of the substrate and including a second portion coupled to second conductive terminal via the anti-ferromagnetic layer along a second interface that extends substantially normal to the surface of the substrate.

8. The method of claim 7, wherein the fixed magnetic layer further includes a bottom portion that extends substantially parallel to the surface of the substrate.

9. The method of claim 7, further comprising:
   depositing a tunnel junction barrier within the trench, the tunnel junction barrier including a first junction portion contacting the first portion of the fixed magnetic layer along a third interface that extends substantially normal to the surface of the substrate, the tunnel junction barrier further including a second junction portion contacting the second portion of the fixed magnetic layer along a fourth interface that extends substantially normal to the surface of the substrate; and
   depositing a free magnetic layer within the trench, the free magnetic layer including a first free portion contacting the first junction portion along a fifth interface that extends substantially normal to the surface of the substrate and including a second free portion contacting the first junction portion along a sixth interface that extends substantially normal to the surface of the substrate.

10. A method of forming a magnetic tunnel junction device, the method comprising:
    forming a trench in a substrate, the trench including a first sidewall, a second sidewall, a third sidewall, a fourth sidewall, and a bottom wall;
    depositing a first conductive terminal within the trench proximate to the first sidewall and depositing a second conductive terminal within the trench;
    depositing a magnetic tunnel junction (MTJ) structure within the trench, the MTJ structure including a fixed magnetic layer having a magnetic field with a fixed magnetic orientation, a tunnel junction layer, and a free magnetic layer having a magnetic field with a configurable magnetic orientation, the MTJ structure adjacent to the first, the second, the third, and the fourth sidewalls at respective first, second, third, and fourth lateral interfaces and adjacent to the bottom wall at a bottom interface, wherein the free magnetic layer includes a first portion adjacent to the first conductive terminal adapted to carry a first magnetic domain to store a first digital value and the free magnetic layer includes a second portion adjacent to the second conductive terminal adapted to carry a second magnetic domain to store a second digital value;
    selectively removing a portion of the MTJ structure that is adjacent to the fourth sidewall to create an opening such that the MTJ structure is substantially u-shaped.

11. The method of claim 10, wherein the first, second, third and fourth lateral interfaces extend approximately perpendicular to a surface of the substrate.

12. The method of claim 10, further comprising forming a third conductive terminal proximate to the third sidewall of the trench.

13. The method of claim 10, further comprising depositing an inter-layer dielectric material into the opening.

14. The method of claim 10, wherein selectively removing the portion of the MTJ structure comprises performing a photo-etching process to define a pattern on the MTJ structure and to remove the portion of the MTJ structure according to the pattern.

15. A magnetic tunnel junction (MTJ) device comprising:
a substrate including a trench having a first sidewall and a second sidewall;
a first lateral electrode disposed within the trench adjacent to the first sidewall;
a second lateral electrode disposed within the trench adjacent to the second sidewall;
a magnetic tunnel junction (MTJ) structure disposed within the trench, the MTJ structure including a fixed magnetic layer having a magnetic field with a fixed magnetic orientation, a tunnel junction layer, and a free magnetic layer having a magnetic field with a configurable magnetic orientation, the MTJ structure contacting the first lateral electrode at a first lateral interface and contacting the second lateral electrode at a second lateral interface; and
a bottom electrode within the trench adjacent to a bottom wall;
wherein the free magnetic layer includes a first portion adjacent to the first lateral electrode adapted to carry a first magnetic domain to store a first digital value;
wherein the free magnetic layer includes a second portion adjacent to the second lateral electrode adapted to carry a second magnetic domain to store a second digital value; and
wherein the free magnetic layer includes a bottom portion adjacent to the bottom electrode adapted to carry a bottom magnetic domain to store a bottom digital value.

16. The MTJ device of claim 15, wherein the trench includes a third sidewall, and further comprising:
a third lateral electrode disposed within the trench adjacent to the third sidewall;
wherein the free magnetic layer includes a third portion adjacent to the third lateral electrode that is adapted to carry a third magnetic domain to store a third digital value.

17. The MTJ device of claim 16, further comprising:
a top electrode coupled to a bit line;
a first switch including a first terminal coupled to the first lateral electrode, a first control terminal coupled to a word line, and a second terminal coupled to a first source line;
a second switch including a third terminal coupled to the second lateral electrode, a second control terminal coupled to the word line, and a fourth terminal coupled to a second source line; and
a third switch including a fifth terminal coupled to the third lateral electrode; a third control terminal coupled to the word line, and a sixth terminal coupled to a third source line.

18. The MTJ device of claim 15, wherein the first sidewall has a length extending substantially parallel to a surface of the substrate and a depth extending substantially perpendicular to the surface, and wherein a ratio of the length to the depth defines an orientation of the magnetic domain of the first portion of the free layer adjacent to the first sidewall.

19. The MTJ device of claim 18, wherein when the length is greater than the depth, the magnetic domain is oriented in a direction that is substantially parallel to the surface of the substrate.

20. The MTJ device of claim 18, wherein when the length is less than the depth, the magnetic domain is oriented in a direction that is substantially perpendicular to the surface of the substrate.

* * * * *

UNITED STATES PATENT AND TRADEMARK OFFICE
CERTIFICATE OF CORRECTION

PATENT NO. : 7,781,231 B2  
APPLICATION NO. : 12/044596  
DATED : August 24, 2010  
INVENTOR(S) : Li Page 1 of 1

It is certified that error appears in the above-identified patent and that said Letters Patent is hereby corrected as shown below:

Column 30, line 2, claim 7: "the anti-ferromagnetic layer" to read as --an anti-ferromagnetic layer--

Column 30, line 51, claim 10: "value;" to read as --value; and--

Column 32, line 16, claim 17: "lateral electrode; a third control terminal" to read as --lateral electrode, a third control terminal--

Signed and Sealed this
Twenty-first Day of June, 2011

David J. Kappos
*Director of the United States Patent and Trademark Office*